United States Patent
Jeon

(10) Patent No.: US 11,114,298 B2
(45) Date of Patent: Sep. 7, 2021

(54) LIGHT GENERATOR INCLUDING DEBRIS SHIELDING ASSEMBLY, PHOTOLITHOGRAPHIC APPARATUS INCLUDING THE LIGHT GENERATOR, AND METHOD OF MANUFACTURING INTEGRATED CIRCUIT DEVICE USING THE PHOTOLITHOGRAPHIC APPARATUS

(71) Applicant: SAMSUNG ELECTRONICS CO., LTD., Suwon-si (KR)

(72) Inventor: Byeong-hwan Jeon, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 242 days.

(21) Appl. No.: 16/234,929

(22) Filed: Dec. 28, 2018

(65) Prior Publication Data

US 2019/0355572 A1 Nov. 21, 2019

(30) Foreign Application Priority Data

May 17, 2018 (KR) .................. 10-2018-0056689

(51) Int. Cl.
*G03F 7/20* (2006.01)
*H01L 21/027* (2006.01)
(Continued)

(52) U.S. Cl.
CPC ........ *H01L 21/0274* (2013.01); *G03F 7/2004* (2013.01); *G21K 1/02* (2013.01);
(Continued)

(58) Field of Classification Search
CPC ............. G03F 7/70033; G03F 7/70925; G03F 7/2053; G03F 7/70916; G03F 7/70958;
(Continued)

(56) References Cited

U.S. PATENT DOCUMENTS

| 6,987,279 B2 | 1/2006 | Hoshino et al. |
| 7,217,941 B2 | 5/2007 | Rettig et al. |

(Continued)

FOREIGN PATENT DOCUMENTS

JP 2008-277481 11/2008

OTHER PUBLICATIONS https://www.quora.com, Carbon Nanotubes, Physics Word Definitions Terminology and Jargon, Nanotechnology, "What is the difference between single walled and multi walled carbon nanotubes?".

(Continued)

*Primary Examiner* — Mesfin T Asfaw
(74) *Attorney, Agent, or Firm* — Lee IP Law, P.C.

(57) ABSTRACT

A method of manufacturing an integrated circuit (IC) device includes forming a photoresist layer on a substrate, and exposing the photoresist layer to light by using a photolithographic apparatus including a light generator. The light generator includes a chamber having a plasma generation space, an optical element in the chamber, and a debris shielding assembly between the optical element and the plasma generation space in the chamber, and the debris shielding assembly includes a protective film facing the optical element and being spaced apart from the optical element with a protective space therebetween, the protective space including an optical path, and a protective frame to support the protective film and to shield the protective space from the plasma generation space.

18 Claims, 18 Drawing Sheets

(51) Int. Cl.
*H05G 2/00* (2006.01)
*G21K 1/06* (2006.01)
*G21K 1/02* (2006.01)
*G21K 1/10* (2006.01)

(52) U.S. Cl.
CPC ............... *G21K 1/06* (2013.01); *G21K 1/10* (2013.01); *H05G 2/008* (2013.01); *G21K 2201/064* (2013.01)

(58) Field of Classification Search
CPC .... G03F 7/40; G03F 7/70891; G03F 7/70058; G03F 7/2041; G03F 7/70341; G03F 7/70983; G03F 7/7015; G03F 7/2004; G03F 7/70175; H05G 2/003; H05G 2/001; H05G 2/006; H05G 2/008; H05G 2/005; H01L 27/3211; H01L 21/0274; G03B 7/20; B82Y 10/00; G21K 1/06; G21K 1/02; G21K 1/10; G21K 2201/064
See application file for complete search history.

(56) References Cited

U.S. PATENT DOCUMENTS

| | | | |
|---|---|---|---|
| 7,663,127 B2 | 2/2010 | Wood, II et al. | |
| 9,826,615 B2 | 11/2017 | Su et al. | |
| 2003/0015665 A1* | 1/2003 | Suzuki | G01T 1/2018 250/370.11 |
| 2005/0279946 A1* | 12/2005 | Rettig | G03F 7/70983 250/396 ML |
| 2006/0221440 A1 | 10/2006 | Banine et al. | |
| 2008/0152873 A1* | 6/2008 | Okoroanyanwu | B82Y 10/00 428/195.1 |
| 2010/0108918 A1 | 5/2010 | Nagai et al. | |
| 2013/0088699 A1 | 4/2013 | Yakunin et al. | |
| 2014/0162465 A1 | 6/2014 | Sporre et al. | |
| 2017/0031142 A1* | 2/2017 | Kim | G02B 19/0095 |
| 2017/0215265 A1 | 7/2017 | Baek et al. | |

OTHER PUBLICATIONS http://www.scielo.br/scielo.php?script=sci_arttext&pid=S0104-66322010000200002, Yit Thai Ong et al., Brazilian Journal of Chemical Engineering, "A review on carbon nanotubes in an environmental protection and green engineering perspective", vol. 27 No. 2 Sao Paulo, Apr./Jun. 2010.

https://www.spiedigitallibrary.org/conference-proceedings-of-spie/10583/105831E/CNTs-in-the-context-of-EUV-pellicle-history-Conference-Presentation/10.1117/12.2297710.full, Emily Gallagher et al., "CNTs in the context of EUV pellicle history", Proceedings of Spie, SPIEDigitalLibrary.org/conference-proceddings-of-spie.

https://iopscience.iop.org/article/10.1088/0957-4484/24/45/452001, Daniel Langley et al., "Flexible transparent conductive materials based on silver nanowire networks: a review", Nanotechnology 24 452001.

https://www.intechopen.com/books/electronic-properties-of-carbon-nanotubes/assembly-of-carbon-nanotube-sheets, Mei Zhang et al., "Assembly of Carbon Nanotube Sheets", Florida State University, pp. 3-20.

* cited by examiner

LIGHT GENERATOR INCLUDING DEBRIS SHIELDING ASSEMBLY, PHOTOLITHOGRAPHIC APPARATUS INCLUDING THE LIGHT GENERATOR, AND METHOD OF MANUFACTURING INTEGRATED CIRCUIT DEVICE USING THE PHOTOLITHOGRAPHIC APPARATUS

CROSS-REFERENCE TO RELATED APPLICATION

Korean Patent Application No. 10-2018-0056689, filed on May 17, 2018, in the Korean Intellectual Property Office, and entitled: "Light generator including debris shielding assembly, photolithographic apparatus including the light generator, and method of manufacturing integrated circuit device using the photolithographic apparatus," is incorporated by reference herein in its entirety.

BACKGROUND

1. Field

The present disclosure relates to a light generator, a photolithographic apparatus including the same, and a method of manufacturing an integrated circuit (IC) device by using the apparatus, and more particularly, to a light generator providing extreme ultraviolet (EUV) light, a photolithographic apparatus including the light generator, and a method of manufacturing an IC device by using the apparatus.

2. Description of the Related Art

Recently, in accordance with high integration of semiconductor devices, various photolithography techniques for forming fine patterns have been developed. In particular, as the degree of integration of semiconductor devices increases, the critical dimension (CD) of a photoresist pattern is further decreasing. To form such a photoresist pattern having a fine CD, EUV light may be adopted as a light source of a photolithographic apparatus. To generate EUV light in the photolithographic apparatus, laser light may be radiated onto a target material in a vacuum chamber to convert the target material into a plasma state.

SUMMARY

According to an aspect of the present disclosure, there is provided a method of manufacturing an integrated circuit (IC) device, the method including forming a photoresist layer on a substrate, and exposing the photoresist layer to light by using a photolithographic apparatus including a light generator, wherein the light generator includes a chamber having a plasma generation space, an optical element in the chamber, and a debris shielding assembly between the optical element and the plasma generation space in the chamber, wherein the debris shielding assembly includes a protective film facing the optical element and being spaced apart from the optical element with a protective space therebetween, the protective space including an optical path, and a protective frame to support the protective film and to shield the protective space from the plasma generation space.

According to another aspect of the present disclosure, there is provided a method of manufacturing an integrated circuit (IC) device, the method including forming a photoresist layer on a substrate, and exposing the photoresist layer to light by using a photolithographic apparatus including a light generator, wherein the light generator includes a chamber having a plasma generation space, an optical collector in the chamber, the optical collector having a reflective surface, and a debris shielding assembly between the optical collector and the plasma generation space in the chamber, wherein the debris shielding assembly includes a protective film being spaced apart from the reflective surface with a protective space therebetween and facing the reflective surface, the protective space including an optical path, and a protective frame that is in contact with an edge portion of the optical collector and supports the protective film.

According to yet another aspect of the present disclosure, there is provided a method of manufacturing an integrated circuit (IC) device, the method including forming a photoresist layer on a substrate, and exposing the photoresist layer to light by using a photolithographic apparatus including a light generator, wherein the light generator includes a chamber having a plasma generation space, an optical collector in the chamber, the optical collector having a reflective surface, and a debris shielding assembly between the optical collector and the plasma generation space in the chamber, wherein the debris shielding assembly includes a protective film facing the reflective surface with a protective space therebetween, the protective space including an optical path, the protective film having a through hole formed in a position corresponding to the optical path in the protective film.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
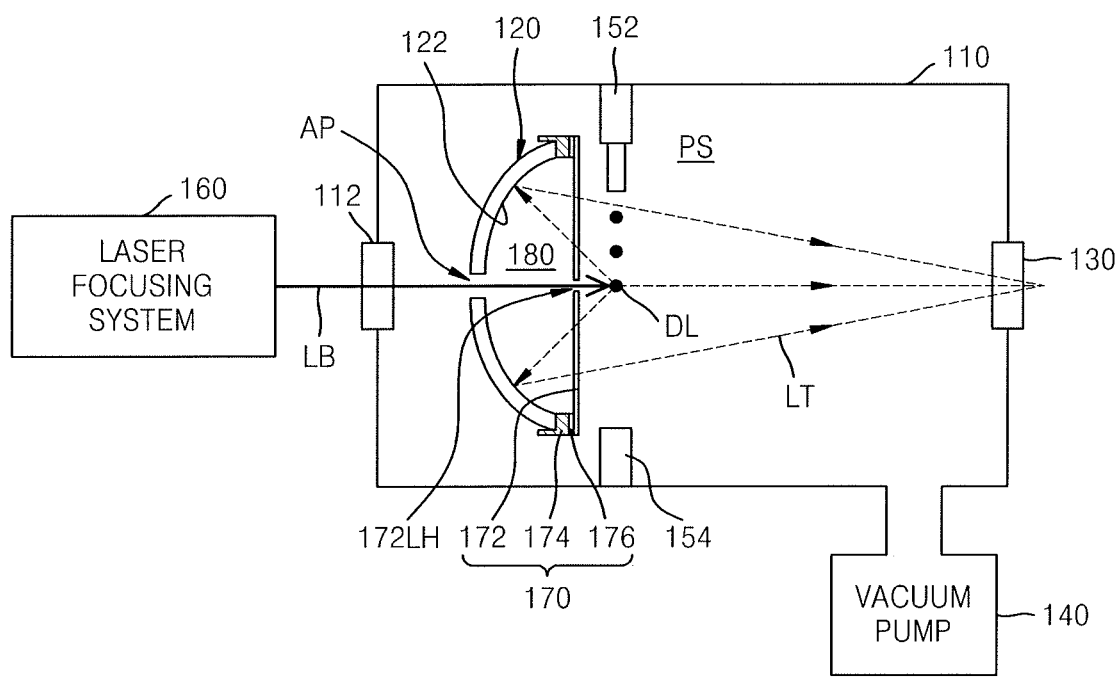
FIG. 1 illustrates a schematic view of main elements in a light generator according to embodiments of the present disclosure.

FIG. 1 is a schematic view illustrating main elements of a light generator 100 according to embodiments of the present disclosure.

Referring to FIG. 1, the light generator 100 may be an extreme ultraviolet (EUV) light generator which generates EUV light using a laser produced plasma (LPP) method. The light generator 100 may include a chamber 110 having a plasma generation space (PS), optical elements arranged in the chamber 110, and a laser focusing system 160 which radiates a laser beam into the chamber 110. The optical elements may include an optical collector 120 and a spectral purity filter (SPF) 130. However, the optical elements are not limited thereto.

The chamber 110 may be provided with an introduction window 112 through which a laser beam (LB) radiated from the laser focusing system 160 may be introduced into the chamber 110. The chamber 110 may be maintained at a vacuum state by an evacuation apparatus 140, e.g., a vacuum pump, installed in the chamber 110.

The light generator 100 may include a droplet generator 152 which provides droplets (DL) of a target material into the chamber 110, and a catcher 154 which collects droplets not involved in a plasma generation reaction among the droplets provided from the droplet generator 152. In the chamber 110, the droplets (DL) may flow in a straight line direction from the droplet generator 152 toward the catcher 154. The target material may include Sn, Li, Ti, Xe, or a combination thereof. In some embodiments, the target material may include pure tin (Sn), a Sn compound, a Sn alloy, or a combination thereof. The Sn compound may be at least one of, e.g., $SnBr_4$, $SnBr_2$, and SnH. The Sn alloy may be at least one of, e.g., Sn—Ga alloy, a Sn—In alloy, and a Sn—In—Ga alloy. However, embodiments are not limited thereto.

The laser focusing system 160 may radiate the laser beam (LB) onto the droplets (DL) of the target material to thereby convert the droplets of the target material into a plasma state in the plasma generation space (PS). For example, the laser focusing system 160 may radiate a pre-pulse laser beam onto a primary target, i.e., the droplet (DL) of the target material, to generate a secondary target, and radiate a main pulse laser beam onto the secondary target to thereby generate plasma from the droplets (DL) of the target material. The pre-pulse laser beam may be a beam having a wavelength of about 1064 nm provided from a Nd:YAG (Yttrium Aluminum Garnet) laser device. The main pulse laser beam may be a beam having a wavelength of about 10.6 μm provided from a $CO_2$ laser device. However, types of the pre-pulse laser beam and the main pulse laser beam are not limited to the above examples. The laser beam (LB) generated from the laser focusing system 160 may be focused onto the droplet (DL) in the chamber 110 through the introduction window 112. While plasma is generated from the droplet (DL), the chamber 110 may be maintained in a comparatively high vacuum condition of about 1 Torr or less.

The optical collector 120 may have a reflective surface 122 capable of collecting and reflecting EUV light having a wavelength of about 1 nm to about 31 nm, e.g., about 13.5 nm, from light having various wavelengths emitted from the plasma generated from the droplets (DL) of the target material in the chamber 110. For example, as illustrated in FIG. 1, the optical collector 120 may be positioned in the chamber 110, such that the reflective surface 122 of the optical collector 120 may face the plasma generation space (PS). The reflective surface 122 may be a concave surface. The reflective surface 122 may selectively reflect EUV light having a wavelength of about 13.5 nm. The optical collector 120 may include a multilayer mirror providing the reflective surface 122. The multilayer mirror may be configured as a stack structure in which a plurality of layers, e.g., a Mo layer, a Si layer, a SiC layer, a $B_4C$ layer, a $Mo_2C$ layer, and a $Si_3N_4$ layer, are alternately stacked upon one another. The optical collector 120 may have an aperture (AP) in a substantially central portion of the optical collector 120, and the aperture (AP) penetrates through the reflective surface 122. The reflective surface 122 may be a curved surface having a prolate ellipsoidal shape concavely converging to the aperture (AP). The laser beam (LB) provided from the laser focusing system 160 may be irradiated through the introduction window 112 of the chamber 110 and through the aperture (AP) of the optical collector 120 onto the droplets (DL) of the target material to generate plasma in the plasma generation space (PS).

The EUV light (LT) collected from the plasma generated in the chamber 110 may be provided to an exposure apparatus, e.g., a scanner or a stepper, through the SPF 130. For example, as illustrated in FIG. 1, light of the EUV light (LT) collected from the plasma generated in the chamber 110 is reflected from the reflective surface 122 of the optical collector 120 toward the SPF 130, e.g., the SPF 130 and the introduction window 112 may be on opposite sidewalls of the chamber 110. The SPF 130 may remove unnecessary light of the EUV light (LT) collected from the plasma generated in the chamber 110, i.e., UV rays, visible rays, and infrared rays, having a longer wavelength than the EUV light (LT) and may transmit only desired EUV light, e.g., light having a wavelength of about 13.5 nm, to the exposure apparatus.

The light generator 100 may further include a debris shielding assembly 170 arranged between the optical collector 120 and the plasma generation space (PS) in the chamber 110. The debris shielding assembly 170 may include a protective film 172, a protective frame 174 supporting the protective film 172, and a fixing member 176 for fixing the protective film 172 to the protective frame 174.

In detail, referring to FIG. 1, the protective film 172 may cover, e.g., overlap, the reflective surface 122 of the optical collector 120. The protective film 172 may be arranged at a location separated from the optical collector 120 with a protective space 180 between the protective film 172 and the reflective surface 122 of the optical collector 120, so a path of the EUV light (LT) is through the protective space 180. For example, as illustrated in FIG. 1, the protective film 172 may be spaced apart a predetermined distance from the reflective surface 122 of the optical collector 120, so the protective space 180 may separate between the protective film 172 and the reflective surface 122. For example, as illustrated in FIG. 1, since the reflective surface 122 may be a curved surface, and the protective film 172 may have a flat surface facing the reflective surface 122. the distance between the reflective surface 122 and the surface of the protective film 172 facing the reflective surface 122 may be non-constant.

The protective film 172 may have a through hole 172LH in a substantially central portion of the protective film 172, e.g., the through hole 172LH may be aligned with the aperture (AP) of the optical collector 120. Therefore, the laser beam (LB) radiated from the laser focusing system 160 may be irradiated onto the droplet (DL) of the target material through the through hole 172LH of the protective film 172 after passing through the introduction window 112 of the chamber 110 and through the aperture (AP) of the optical collector 120. In some embodiments, the protective film 172 may not have the through hole 172LH.

The protective frame 174 may be arranged to contact an edge portion of the optical collector 120, e.g., the protective frame 174 may connect between the edge portion of the optical collector 120 and the protective film 172. The protective frame 174 may shield, at the edge portions of the protective film 172 and the optical collector 120, the protective space 180 from the plasma generation space (PS). For example, as illustrated in FIG. 1, the protective frame 174 may be directly between the edge portion of the optical collector 120 and the protective film 172, e.g., along entire perimeters of the optical collector 120 and the protective film 172, so the protective space 180 may be shielded, e.g., completely separated from the plasma generation space (PS), e.g., with the exception of the through hole 172LH.

The protective frame 174 may have a planar shape corresponding to a planar shape of the edge portion of the optical collector 120. For example, when the edge portion of the optical collector 120 has a circular ring shape in a front view facing the reflective surface 122 of the optical collector 120, e.g., when looking from the SPF 130 toward the reflective surface 122, the protective frame 174 may have a circular ring shape corresponding to, e.g., overlapping, the edge portion of the optical collector 120. For example, the protective frame 174 may, e.g., continuously, extend along an, e.g., entire. edge perimeter of the optical collector 120.

In some embodiments, the protective film 172 may include a material that is transparent to the EUV light (LT).

In some other embodiments, the protective film 172 may include a material transparent to the laser beam (LB) radiated from the laser focusing system 160 and the EUV light (LT). For example, the protective film 172 may include a material transparent to a laser beam having a wavelength of about 1064 nm, a laser beam having a wavelength of about 10.6 μm, and EUV light having a wavelength of about 13.5 nm. In this case, even when the protective film 172 does not have the through hole 172LH, the laser beam (LB) radiated from the laser focusing system 160 may transmit through the protective film 172.

In some embodiments, the protective film 172 may include at least one of carbon isomers. For example, the protective film 172 may include carbon nanotubes, diamond, graphite, graphene, fullerene, or a combination thereof.

In some embodiments, the protective film 172 may include a carbon nanotube film including single-wall carbon nanotubes (SWCNT), multiwall carbon nanotubes (MWCNT), or a combination thereof.

In some other embodiments, the protective film 172 may include a diamond layer. In some embodiments, the diamond layer may be a layer formed by using a chemical vapor deposition (CVD) process. For example, the diamond layer may be obtained by depositing diamond on a support substrate with a combination of methane and hydrogen gases at a temperature of about 800° C. to about 1,200° C. under reduced pressure. The inclusion of the hydrogen gas may prevent growth of graphite during nucleation and growth of the diamond. However, according to embodiments of the present disclosure, a process of forming the diamond layer available as the protective film 172 is not limited to the above-described example method. A diamond layer available as the protective film 172 may be obtained through any of a variety of methods known in the art.

In some other embodiments, the protective film 172 may include a diamond-like carbon (DLC) film. The DLC film may include amorphous carbon including a $sp^3$ carbon bond and a $sp^2$ carbon bond. The DLC film may include $sp^3$ carbon bonds and $sp^2$ carbon bonds in a ratio of about 1:1. However, embodiments are not limited thereto.

In some other embodiments, the protective film 172 may include a graphene-carbon nanotube composite. The graphene-carbon nanotube composite may include graphene and carbon nanotubes in a weight ratio of about 2:1 to about 1:5.

In some embodiments, the protective film 172 may have a thickness of about 2 nm to about 500 nm. However, embodiments of the present disclosure are not limited thereto.

The protective frame 174 of the debris shielding assembly 170 may support the protective film 172, in contact with the edge portion of the optical collector 120. The protective frame 174 may include a metal. For example, the protective frame 174 may include Al, stainless steel, Mo, or a combination thereof.

The debris shielding assembly 170 may include the fixing member 176 for fixing the protective film 172 to the protective frame 174. In some embodiments, the fixing member 176 may include an adhesive layer. In some embodiments, the adhesive layer may include a thermosetting epoxy resin or bovine serum albumin (BSA). However, embodiments of the present disclosure are not limited thereto.

In some embodiments, the debris shielding assembly 170 may not include the fixing member 176 between the protective film 172 and the protective frame 174. Instead, the protective film 172 may be fixed directly onto the protective frame 174 by pressing.

Although FIG. 1 illustrates an embodiment in which the optical collector 120 as an optical element is protected by the debris shielding assembly 170, embodiments of the present disclosure are not limited to the embodiment illustrated in FIG. 1. For example, the debris shielding assembly 170 may be installed to protect the SPF 130, e.g., between the SPF 130 and the plasma generation space (PS), or other optical elements in the chamber 110.

For example, if the debris shielding assembly 170 were not in the chamber 110, during plasma generation in the plasma generation space PS, debris, e.g., particles unable to become plasma, would be deposited on surfaces of optical elements, e.g., on a surface of the optical collector 120 or on a surface of the SPF 130, thereby lowering operation efficiency, e.g., reflectance or transmittance, thereof. While efforts could be made to clean the surfaces of the optical elements in the chamber 110, e.g., via various cleaning gases or radicals obtained from cleaning gases, the cleaning processes, e.g., using cleaning gases or radicals, would raise the processing costs, and optical characteristics, e.g., reflectance, of the optical elements would be deteriorated due to repeated deposition of debris generated from the target material in the chamber 110. Further, the surfaces of the optical elements would also be deteriorated by the cleaning gases or radicals, and accordingly, durability would be lowered.

In contrast, according to embodiments of the present disclosure, the light generator 100 may include the debris shielding assembly 170 installed between optical elements which are prone to contamination by debris and the plasma generation space (PS) in the chamber 110. For example, as illustrated in FIG. 1, the debris shielding assembly 170 may be installed between the optical collector 120 and the plasma generation space (PS). Accordingly, when debris generated from the droplet (DL) in the plasma generation space (PS) flows from the plasma generation space (PS) toward the reflective surface 122 of the optical collector 120, various travel paths of the debris to the reflective surface 122 of the optical collector 120 may be blocked by the protective film 172 and the protective frame 174. In particular, even when the debris generated from the droplet (DL) in the plasma generation space (PS) is likely to move from the plasma generation space (PS) towards the reflective surface 122 of the optical collector 120 through the space between the protective film 172 and the optical collector 120 via various travel paths of the debris, there is no concern of flowing of the debris from the plasma generation space (PS) towards the reflective surface 122 of the optical collector 120 through the space between the protective film 172 and the optical collector 120, since the protective space 180 is shielded by the protective frame 174 of the debris shielding assembly 170 at the edge portions of the protective film 172 and the optical collector 120.

Thus, it is unlikely that debris generated in the plasma generation space (PS) flows to the reflective surface 122 of the optical collector 120 and into the protective space 180 extending a predetermined distance from the reflective surface 122 of the optical collector 120 to the protective film 172. Accordingly, the reflective surface 122 of the optical collector 120 may be protected from contamination by the debris, and the performance of the optical collector 120 may also be maintained without periodic cleaning.

In the light generator 100 according to the one or more embodiments of the present disclosure, the internal environment of the chamber 110 may be maintained under a stable operation condition only by periodic cleaning and/or replacement of the protective film 172 and the protective frame 174, without cleaning the optical elements in the chamber 110. Accordingly, without the need to perform the cleaning process using a gas source, which may increase the process cost and deteriorate the optical elements, the contamination of the optical elements by debris and consequential productivity reduction may be prevented or substantially minimized.

Figure 2A:
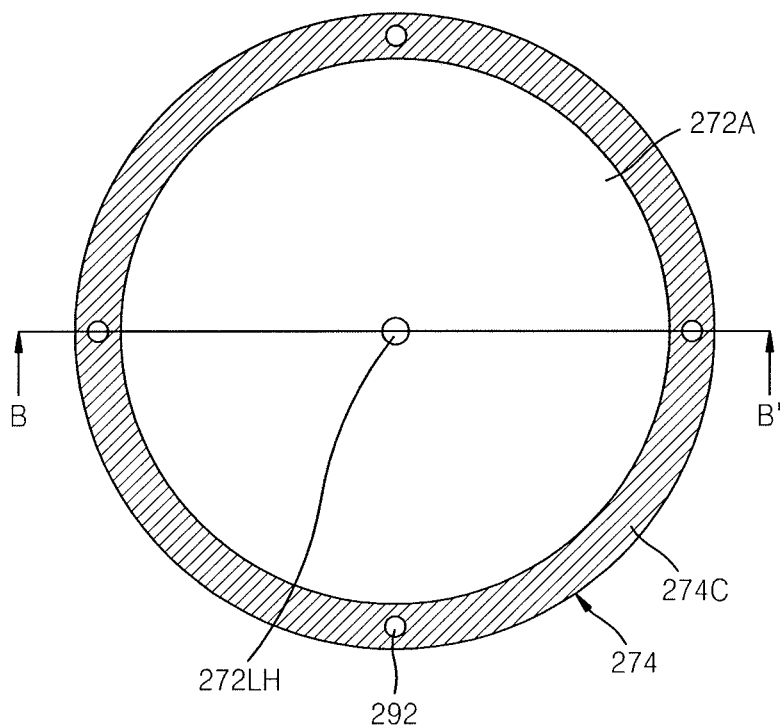
FIG. 2A illustrates a plane view of an example configuration of a debris shielding assembly according to an embodiment.
Figure 2B:
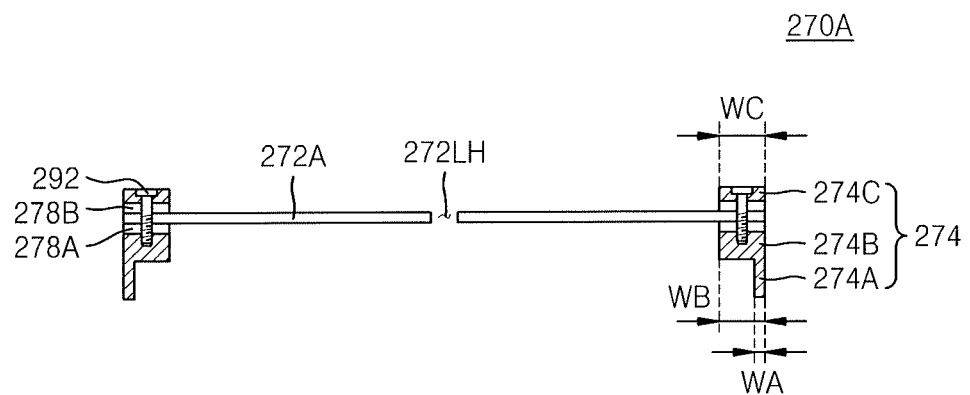
FIG. 2B illustrates a cross-sectional view taken along line B-B' in FIG. 2A.

FIG. 2A is a plane view illustrating an example configuration of a debris shielding assembly 270A which may be employed in a light generator according to embodiments of the present disclosure. FIG. 2B is a cross-sectional view taken along line B-B' in FIG. 2A. In FIGS. 2A and 2B, like reference numerals as those in FIG. 1 refer to like elements, and thus redundant descriptions thereof are omitted here.

Referring to FIGS. 2A and 2B, similar to the debris shielding assembly 170 illustrated in FIG. 1, the debris shielding assembly 270A may include a protective film 272A and a protective frame 274 supporting the protective film 272A.

The protective film 272A may have a substantially same configuration as that of the protective film 172 described above with reference to FIG. 1. The protective film 272A may have a through hole 272LH in a substantially central portion thereof.

The protective frame 274 may include a support portion 274A, a shield portion 274B that is integrally connected with the support portion 274A and extends between the support portion 274A and the protective film 272A, and an outer fixing portion 274C that faces the shield portion 274B with the protective film 272A therebetween. The outer fixing portion 274C supports the protective film 272A in cooperation with the shield portion 274B.

The support portion 274A, the shield portion 274B, and the outer fixing portion 274C, which constitute the protective frame 274, may have a substantially circular planar shape. Outer diameters of the support portion 274A, the shield portion 274B, and the outer fixing portion 274C may substantially be the same. The support portion 274A, the shield portion 274B, and the outer fixing portion 274C may include a metal. For example, the support portion 274A, the shield portion 274B, and the outer fixing portion 274C may include Al, stainless steel, Mo, or a combination thereof.

The support portion 274A may be a ring member having a straight cross-sectional shape extending from the shield portion 274B. A width WA of the support portion 274A may be less than a width WB of the shield portion 274B. In some embodiments, the width WB of the shield portion 274B may substantially be the same as the width WC of the outer fixing portion 274C. In some other embodiments, the width WB of the shield portion 274B may be different from the width WC of the outer fixing portion 274C.

The protective frame 274 may further include a first buffer film 278A between the shield portion 274B and the protective film 272A, and a second buffer film 278B between the protective film 272A and the outer fixing portion 274C. In some embodiments, the first buffer film 278A and the second buffer film 278B may include an elastic material. For example, each of the first buffer film 278A and the second buffer film 278B may include a polyimide film and/or an engineering plastic material, e.g., polyetheretherketone (PEEK).

The protective frame 274 may further include a fixing member 292 for maintaining the protective film 272A and the protective frame 274 bound to each other. The fixing member 292 may include a screw. In some embodiments, the fixing member 292 may include a metal. However, embodiments of the present disclosure are not limited thereto.

Figure 2C:
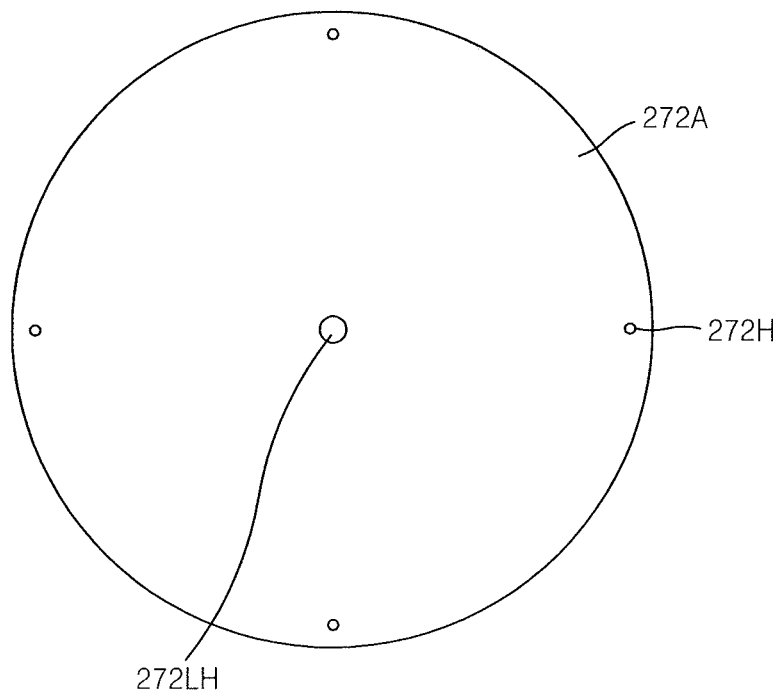
FIG. 2C illustrates a plane view of a protective film included in the debris shielding assembly in FIGS. 2A and 2B.

FIG. 2C is a plane view of the protective film 272A included in the debris shielding assembly 270A as illustrated in FIGS. 2A and 2B.

Referring to FIG. 2C, the protective film 272A may have a circular shape in a plane view, having a substantially same outer diameter as the diameter of the protective frame 274, e.g., the protective film 272A may have a same outer diameter as an outer diameter of the ring-shaped protective frame 274. The protective film 272A may include a through hole 272LH in a substantially central portion thereof and a plurality of holes 272H in, e.g., spaced apart along, an edge portion thereof. The fixing member 292 illustrated in FIGS. 2A and 2B may penetrate through the plurality of holes 272H. A material of the protective film 272A may be the same as that of the protective film 172 described above with reference to FIG. 1.

Figure 2D:
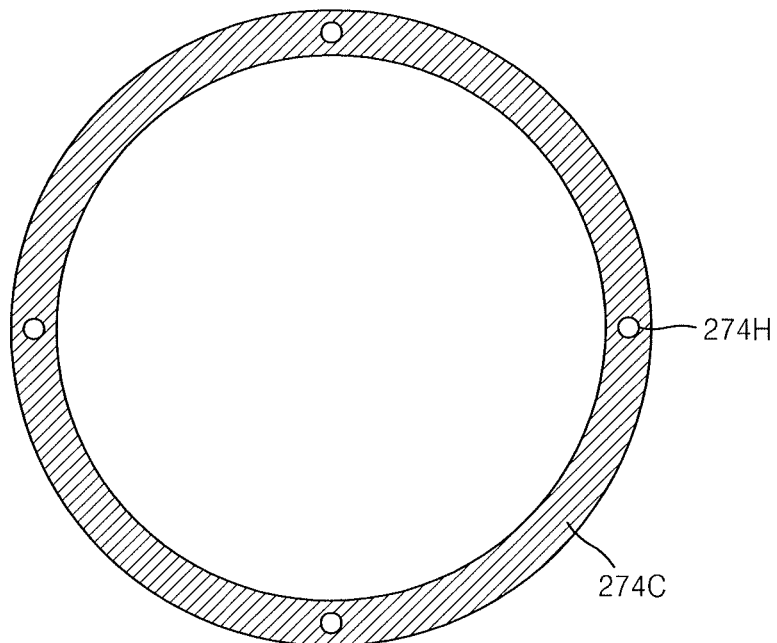
FIG. 2D illustrates a plane view of an outer fixing portion included in the debris shielding assembly in FIGS. 2A and 2B.

FIG. 2D is a plane view of the outer fixing portion 274C included in the debris shielding assembly 270A as illustrated in FIGS. 2A and 2B.

Referring to FIG. 2D, the outer fixing portion 274C may have a circular shape in a plane view. The outer fixing portion 274C may include a plurality of holes 274H which the fixing member 292 illustrated in FIGS. 2A and 2B may penetrate through. A planar structure of the shield portion 274B illustrate in FIGS. 2A and 2B may substantially be the same as the planar structure of the outer fixing portion 274C illustrated in FIG. 2D.

Figure 2E:
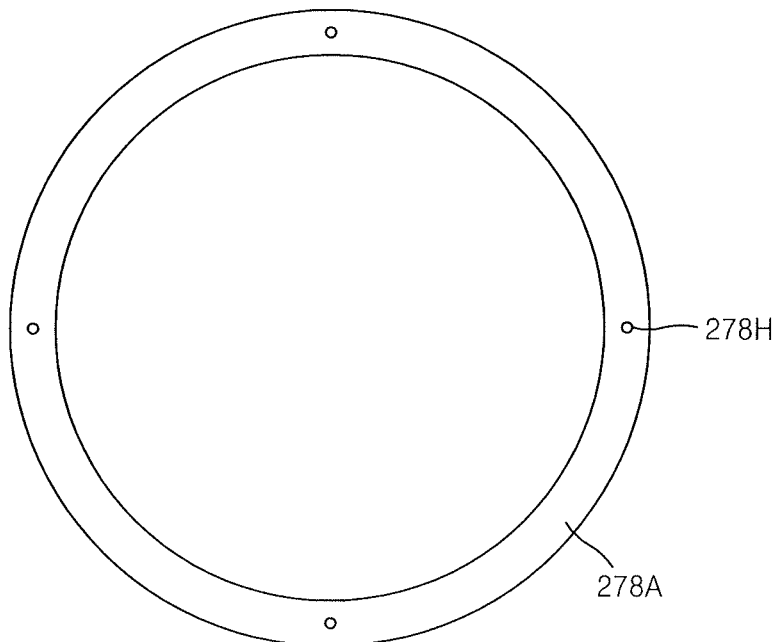
FIG. 2E illustrates a plane view of a first buffer film included in the debris shielding assembly in FIGS. 2A and 2B.

FIG. 2E is a plane view of the first buffer film 278A included in the debris shielding assembly 270A as illustrated in FIGS. 2A and 2B.

Referring to FIG. 2E, the first buffer film 278A may have a circular planar shape. The first buffer film 278A may include a plurality of holes 278H which the fixing member 292 illustrated in FIGS. 2A and 2B penetrates through. A planar structure of the second buffer film 278B illustrated in FIGS. 2A and 2B may substantially be the same as the planar structure of the first buffer film 278A illustrated in FIG. 2E.

Figure 2F:
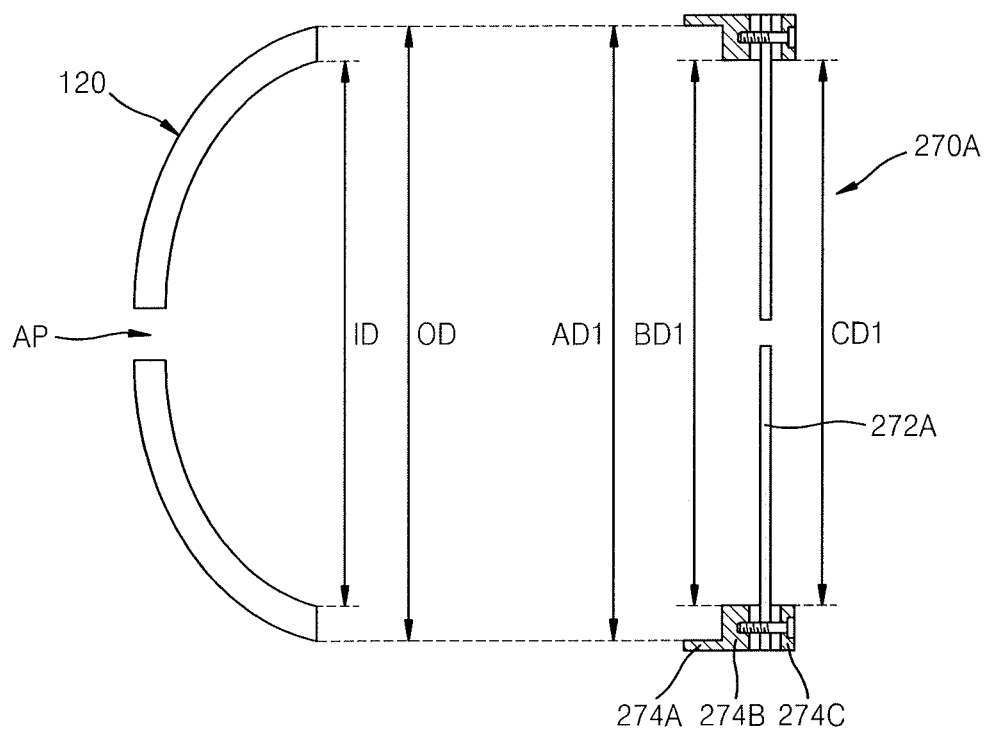
FIG. 2F illustrates a state before the debris shielding assembly of FIGS. 2A and 2B and an optical collector are coupled together.
Figure 2G:
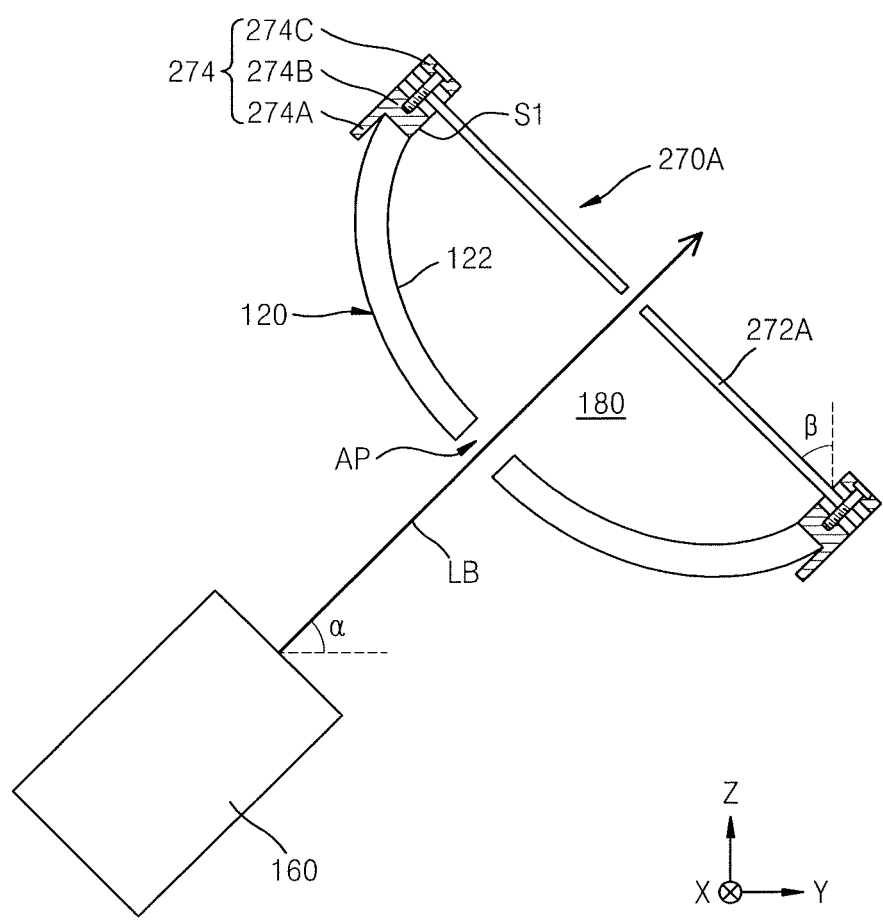
FIG. 2G illustrates a state where the debris shielding assembly of FIGS. 2A and 2B and the optical collector are coupled together.

FIG. 2F illustrates a state before the debris shielding assembly 270A and the optical collector 120 are coupled together. FIG. 2G illustrates a state where the debris shielding assembly 270A and the optical collector 120 are coupled together.

Referring to FIG. 2F, in the debris shielding assembly 270A, an inner diameter AD1 of the support portion 274A may be greater than an inner diameter BD1 of the shield portion 274B. An outer diameter OD of the outermost edge portion of the optical collector 120 farthest away from the aperture AP may be equal to or less than the inner diameter AD1 of the support portion 274A. An inner diameter ID of the edge portion of the optical collector 120 may substantially be the same as an inner diameter BD1 of the shield portion 274B.

Therefore, to couple the optical collector 120 to the debris shielding assembly 270A, the edge portion of the optical collector 120 may be inserted into the support portion 274A. That is, the edge portion of the optical collector 120 may be positioned to abut, e.g., directly contact, a surface of the shield portion 274B facing the optical collector 120, so the support portion 274A is flush against and surrounds an outer diameter of the optical collector 120. As a result, as illustrated in FIG. 2G, the edge portion of the optical collector 120 may partially be surrounded by the support portion 274A.

In some embodiments, in the light generator 100 (see FIG. 1), the optical collector 120 may be installed such that the reflective surface 122 is inclined in a vertical direction (Z direction) with respect to a horizontal direction (X-Y plane direction) at a certain angle, e.g., by a first acute angle ($\alpha$). The laser beam (LB) may be radiated from the laser focusing system 160 at a certain tilt angle, e.g., the first acute angle ($\alpha$), in a vertical direction (Z direction) with respect to the horizontal direction (X-Y plane direction, such as to pass through the aperture (AP) of the optical collector 120 and the through hole 272LH of the protective film 272A.

As illustrated in FIG. 2G, with the optical collector 120 coupled to the debris shielding assembly 270A, the protective film 272A facing the reflective surface 122 of the optical collector 120 may extend tilted at a predetermined angle towards the optical collector 120, e.g., at a second acute angle $\beta$, with respect to the vertical direction (Z direction). To couple the optical collector 120 to the debris shielding assembly 270A, as the edge portion of the optical collector 120 is inserted into the support portion 274A, an upper portion of the support portion 274A and an upper portion of the shield portion 274B of the debris shielding assembly 270A may contact the upper edge portion of the optical collector 120 due to gravity, so that the upper edge portion of the optical collector 120 may support the debris shielding assembly 270A. Accordingly, no binding tools may be needed for coupling the optical collector 120 to the debris shielding assembly 270A.

The shield portion 274B may have an inner surface S1 facing the protective space 180 between the support portion 274A and the protective film 272A. In the state where the optical collector 120 and the debris shielding assembly 270A are coupled together, an edge of the inner surface S1 of the shield portion 274B and an edge portion of the reflective surface 122 of the optical collector 120 may contact each other, and the inner surface S1 and the reflective surface 122 may smoothly extend, e.g., may be level with each other and directly contact each other, forming one, e.g., sealed, plane without a step difference in a contact region between the inner surface S1 and the reflective surface 122.

In the light generator 100 illustrated in FIG. 1, the debris shielding assembly 270A illustrated in FIGS. 2A and 2B may be employed instead of the debris shielding assembly 170. In the state where the optical collector 120 and the debris shielding assembly 270A are coupled together, the protective film 272A and the shield portion 274B may shield the protective space 180 from the plasma generation space (PS) (see FIG. 1). Accordingly, the debris generated in the plasma generation space (PS) may unlikely flow into the protective space 180 between the reflective surface 122 and the protective film 272A from the plasma generation space (PS). In particular, due to the shield portion 274B between the edge portion of the optical collector 120 and the protective film 272A, the debris generated in the plasma generation space (PS) may unlikely flow through a gap between the edge portion of the optical collector 120 and the protective film 272A into the protective space 180 and the reflective surface 122 of the optical collector 120 from the plasma generation space PS. Accordingly, the reflective surface 122 of the optical collector 120 may be protected from contamination by the debris.

Figure 3A:
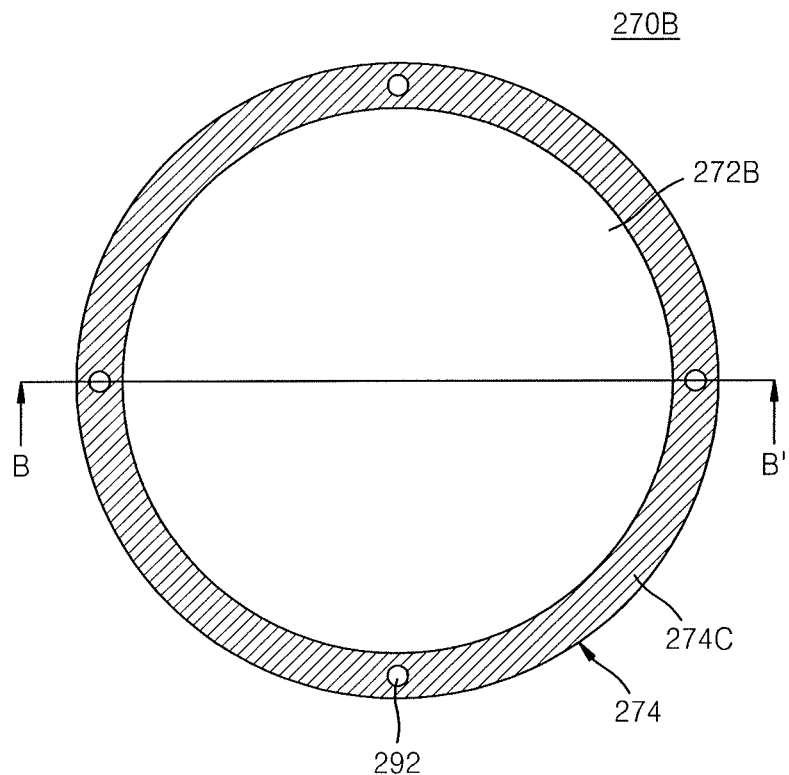
FIG. 3A illustrates a plane view of a debris shielding assembly according to another embodiment.
Figure 3B:
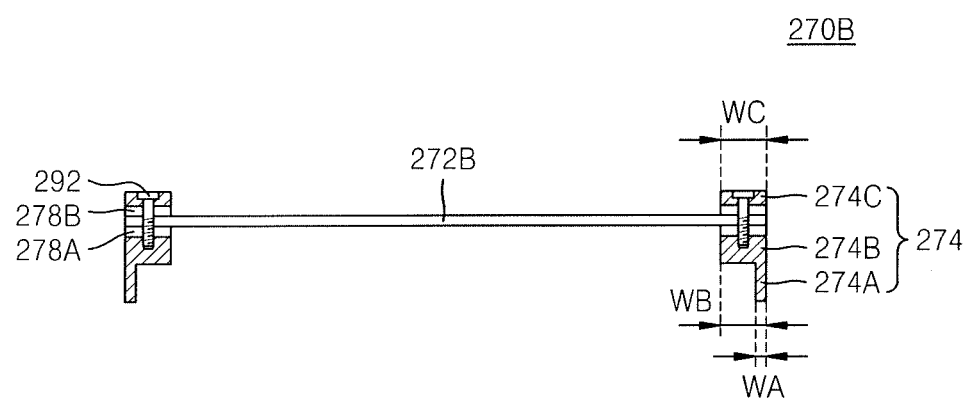
FIG. 3B illustrates a cross-sectional view taken along line B-B' in FIG. 3A.
Figure 3C:
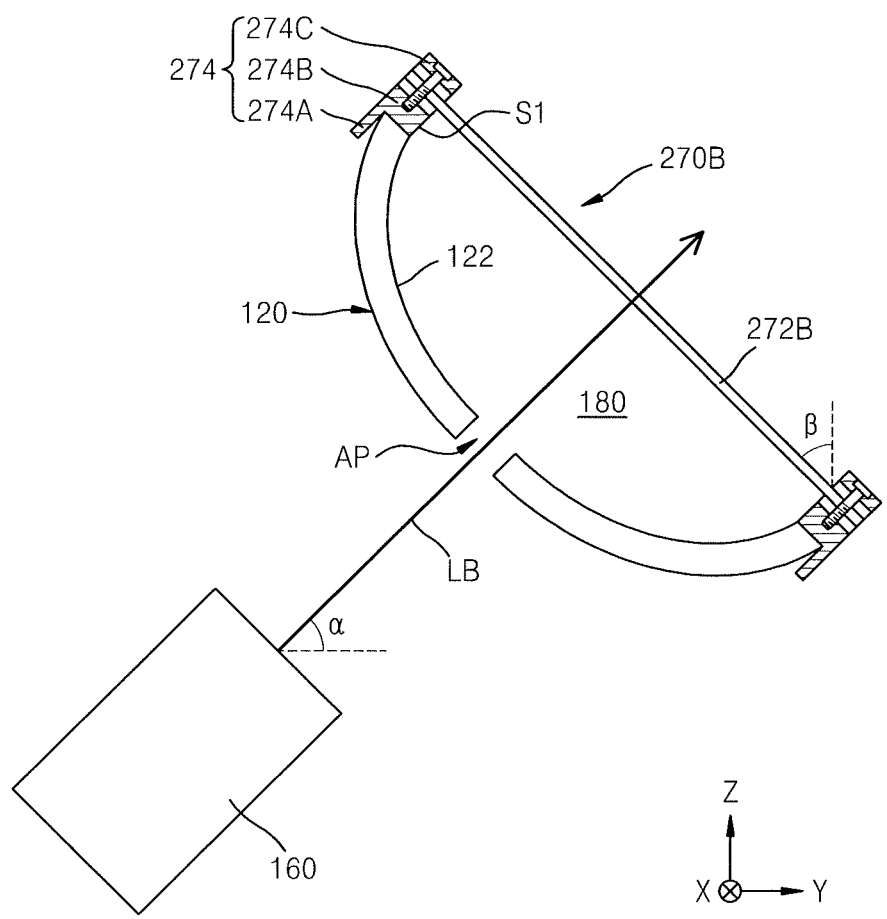
FIG. 3C illustrates a state in which the debris shielding assembly of FIGS. 3A and 3B and the optical collector are coupled together.

FIG. 3A is a plane view for explaining an example configuration of a debris shielding assembly 270B according to an embodiment, which may be used in the light generator according to embodiments of the present disclosure. FIG. 3B is a cross-sectional view taken along line B-B' in FIG. 3A. FIG. 3C is a view illustrating a state in which the debris shielding assembly 270B and the optical collector 120 are coupled. In FIGS. 3A to 3C, like reference numerals as those in FIGS. 1 to 2G refer to like elements, and thus redundant descriptions thereof are omitted.

Referring to FIGS. 3A to 3C, the debris shielding assembly 270B may have a substantially same structure as the debris shielding assembly 270A illustrated in FIGS. 2A and 2B. Unlike the debris shielding assembly 270A, the debris shielding assembly 270B may not have the through hole 272LH (see FIGS. 2A to 2C) at a center portion. Accordingly, the laser beam (LB) passing through the aperture (AP) of the optical collector 120 after being radiated from the laser focusing system 160 may be transmitted through a protective film 272B to irradiate the droplet (DL) of the target material (see FIG. 1). Examples of the material of the protective film 272B may be the same as those of the protective film 172 described above with reference to FIG. 1. The debris shielding assembly 270B illustrated in FIGS. 3A and 3B may be employed in the light generator 100 of FIG. 1, instead of the debris shielding assembly 170.

In the state where the optical collector 120 and the debris shielding assembly 270B are coupled together, the protective film 272B and the shield portion 274B may shield the protective space 180 from the plasma generation space (PS) (see FIG. 1). Accordingly, the debris generated in the plasma generation space (PS) is unlikely to flow through a gap between the edge portion of the optical collector 120 and the protective film 272B into the protective space 180 and the reflective surface 122 of the optical collector 120 from the plasma generation space (PS). Accordingly, the reflective surface 122 of the optical collector 120 may be protected from contamination by the debris.

Figure 4A:
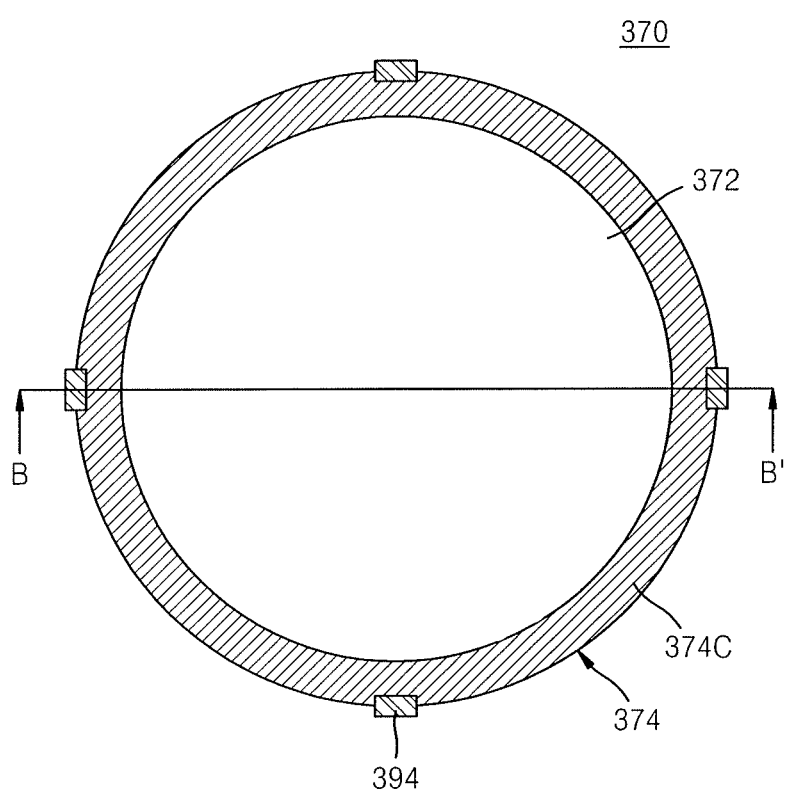
FIG. 4A illustrates a plane view of a debris shielding assembly according to another embodiment.
Figure 4B:
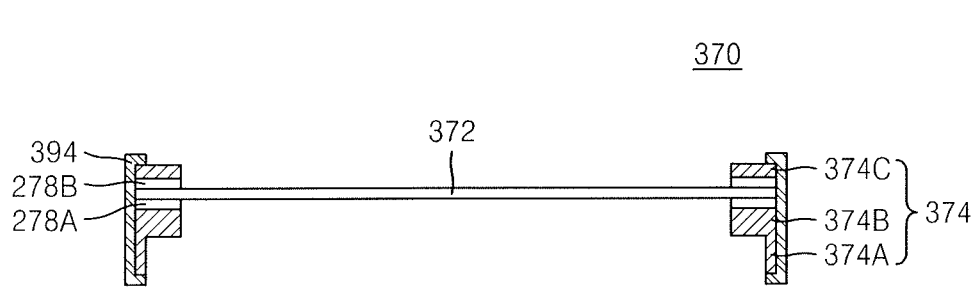
FIG. 4B illustrates a cross-sectional view taken along line B-B' in FIG. 4A.

FIG. 4A is a plane view for explaining an example configuration of a debris shielding assembly 370 according to an embodiment, which may be used in the light generator according to embodiments of the present disclosure. FIG. 4B is a cross-sectional view taken along line B-B' in FIG. 4A. In FIGS. 4A and 4B, like reference numerals as those in FIGS. 1 to 3C refer to like elements, and thus redundant descriptions thereof are omitted.

Referring to FIGS. 4A and 4B, the debris shielding assembly 370 may have a substantially same configuration as the debris shielding assembly 270A illustrated in FIGS. 2A and 2B. Unlike the debris shielding assembly 270A, the debris shielding assembly 370 may include a protective film 372. and a protective frame 374 supporting the protective film 372. The protective frame 374 of the debris shielding assembly 370 may include a support portion 374A, a shield portion 374B, and an outer fixing portion 374C. The support portion 374A, the shield portion 374B, and the outer fixing portion 374C of the protective frame 374 may have substantially same configurations as those of the support portion 274A, the shield portion 274B, and the outer fixing portion 274C of the debris shielding assembly 270A, respectively. Unlike the debris shielding assembly 270A, the debris shielding assembly 370 may not have a through hole 272LH at a center portion thereof. Accordingly, the laser beam (LB) passing through the aperture (AP) of the optical collector 120 after being radiated from the laser focusing system 160 illustrated in FIG. 1 may be transmitted through the protective film 372 to irradiate the droplet (DL) of the target material (see FIG. 1). Examples of the material of the protective film 372 may be the same as those of protective film 172 described above with reference to FIG. 1.

Further, the support portion 374A, the shield portion 374B, and the outer fixing portion 374C of the protective frame 374, and the protective film 372 may not have holes for the fixing member 292 illustrated in FIGS. 2A and 2B. To fix the protective film 372 to the protective frame 374, the debris shielding assembly 370 may have a fixing member 394 of a press type, e.g., a clamp or a binder clip. In some embodiments, the fixing member 392 may include a metal. However, embodiments are not limited thereto.

In the light generator 100 illustrated in FIG. 1, the debris shielding assembly 370 illustrated in FIGS. 4A and 4B may be employed instead of the debris shielding assembly 170. In the state where the optical collector 120 and the debris shielding assembly 370 are coupled together, the protective film 372 and the shield portion 374B may shield the protective space 180 (see FIG. 1) in front of the reflective surface 122 of the optical collector 120 from the plasma generation space (PS) (see FIG. 1). Accordingly, the debris generated in the plasma generation space (PS) is unlikely to flow into the protective space 180 and the reflective surface 122 from the plasma generation space (PS), so that the reflective surface 122 of the optical collector 120 may be protected from contamination by the debris.

Figure 5A:
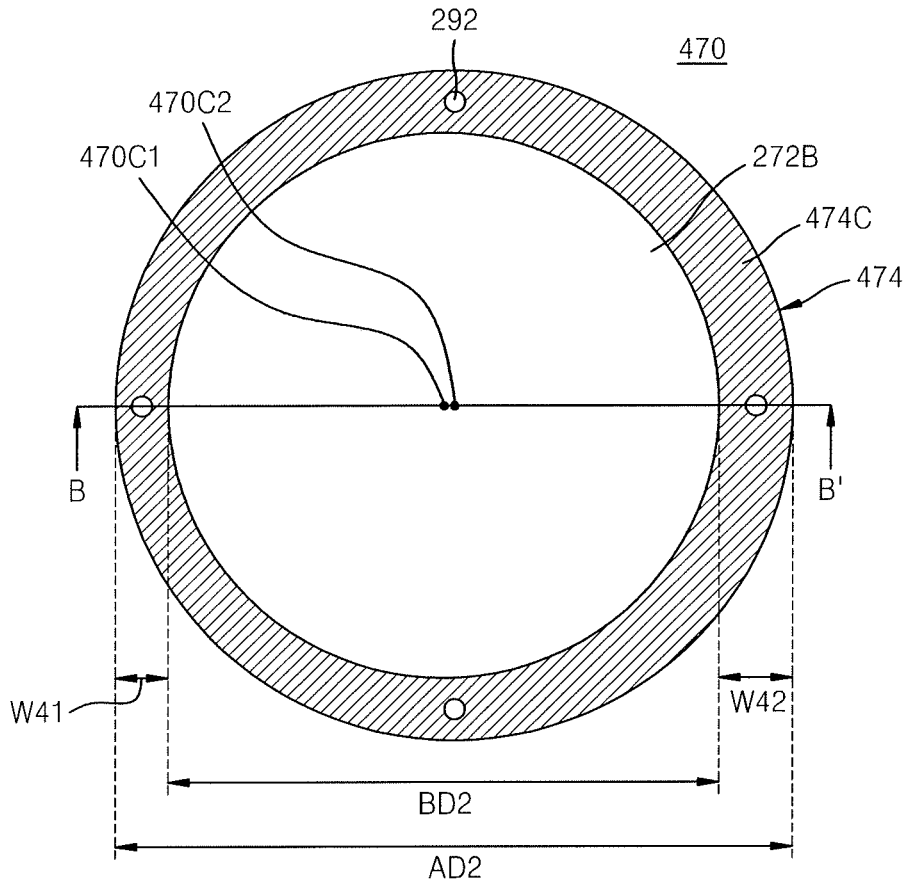
FIG. 5A illustrates a plane view of a debris shielding assembly according to another embodiment.
Figure 5B:
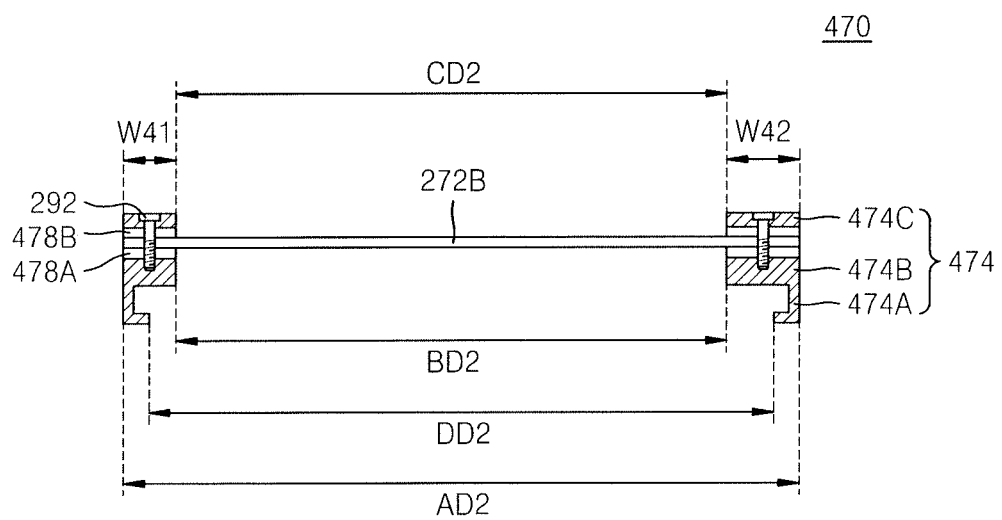
FIG. 5B illustrates a cross-sectional view taken along line B-B' in FIG. 5A.

FIG. 5A is a plane view for explaining an example configuration of a debris shielding assembly 470 according to an embodiment, which may be used in the light generator according to embodiments of the present disclosure. FIG. 5B is a cross-sectional view taken along line B-B' in FIG. 5A. In FIGS. 5A and 5B, like reference numerals as those in FIGS. 1 to 3C refer to like elements, and thus redundant descriptions thereof are omitted.

Referring to FIGS. 5A and 5B, the debris shielding assembly 470 may have a substantially same configuration as the debris shielding assembly 270B illustrated in FIGS. 3A and 3B. Unlike the debris shielding assembly 270B, the debris shielding assembly 470 may include a protective frame 474 supporting the protective film 272B. The protective frame 474 of the debris shielding assembly 470 may include a support portion 474A, a shield portion 474B, and an outer fixing portion 474C. The support portion 474A, the shield portion 474B, and the outer fixing portion 474C of the protective frame 474 may have substantially same configurations as those of the support portion 274A, the shield portion 274B, and the outer fixing portion 274C of the debris shielding assembly 270B, respectively, as described above with reference to FIGS. 3A and 3B. Unlike the debris shielding assembly 270B, a central axis 470C1 of an inner diameter BD2 of the protective frame 474 and a central axis 470C2 of an outer diameter AD2 of the protective frame 474 may not correspond to each other and be misaligned. The central axis 470C2 of the outer diameter AD2 of the protective frame 474 may correspond to a central axis of the debris shielding assembly 470. The support portion 474A, the shield portion 474B, and the outer fixing portion 474C of the protective frame 474 may have widths varying in a circumferential direction with respect to the central axis 470C2 of the outer diameter AD2 of the protective frame 474, i.e., the central axis of the debris shielding assembly 470. The support portion 474A may include a ring member having an L-like cross-sectional shape extending from the shield portion 474B.

In detail, in the support portion 474A, the shield portion 474B, and the outer fixing portion 474C of the protective frame 474, a width W41 of each of the support portion 474A, the shield portion 474B, and the outer fixing portion 474C at a first edge of the protective frame 474 may be less than a width W42 of the same elements at a second edge of the protective frame 474. The first and second edges of the protective frame 474 may be opposite edges of the protective frame 474 along a straight line (i.e., diameter) crossing the central axis 470C2 of the outer diameter AD2 of the protective frame 474.

In the debris shielding assembly 470, an inner diameter DD2 of the support portion 474A may be greater than an inner diameter BD2 of the shield portion 474B. The inner diameter DD2 of the support portion 474A may be greater than an outer diameter OD of the edge portion of the optical collector 120 (see FIG. 2F). An inner diameter ID of the edge portion of the optical collector 120 may substantially be the same as the inner diameter BD2 of the shield portion 474B.

Figure 5C:
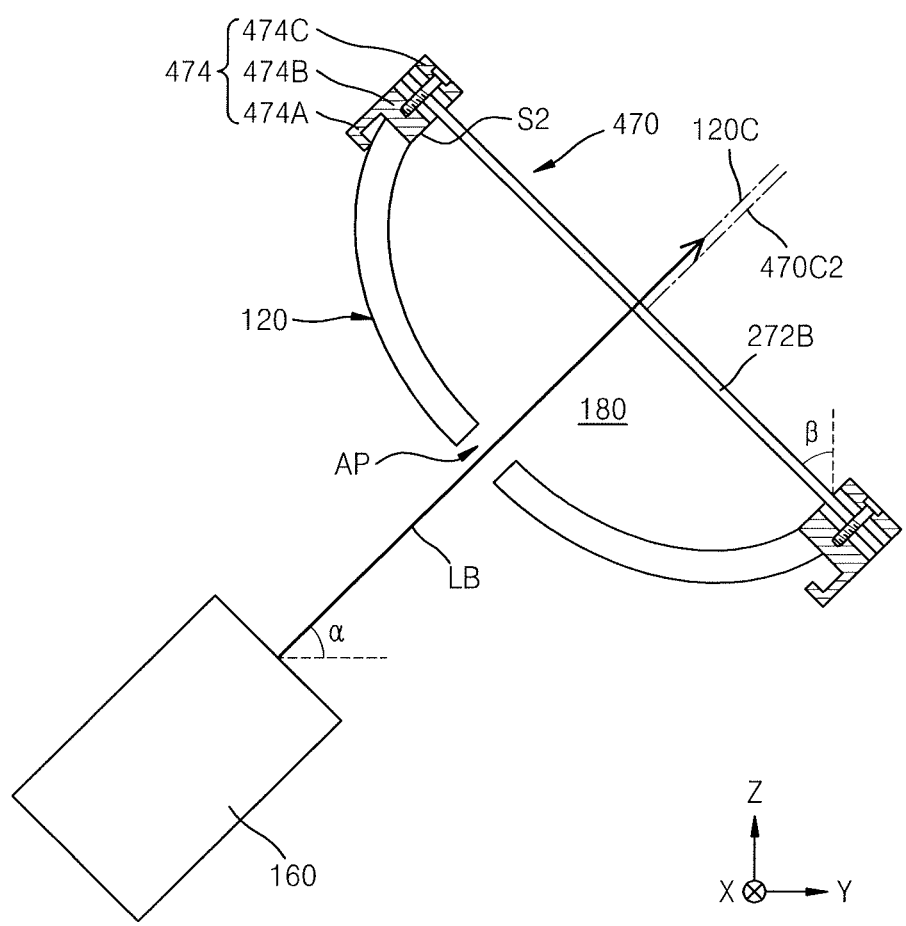
FIG. 5C illustrates a state where the optical collector and the debris shielding assembly are coupled together.

FIG. 5C is a view illustrating a state where the optical collector 120 and the debris shielding assembly 470 are coupled together.

Referring to FIGS. 5A to 5C, to couple the optical collector 120 to the debris shielding assembly 470, the edge portion of the optical collector 120 may be inserted into the support portion 474A. Once the optical collector 120 and the debris shielding assembly 470 are coupled together, the edge portion of the optical collector 120 may partially be surrounded by the support portion 474A.

In the state where the optical collector 120 and the debris shielding assembly 470 are coupled together, the protective film 272B facing the reflective surface 122 of the optical collector 120 may extend tilted at a predetermined angle towards the optical collector 120, e.g., at the second acute angle β, with respect to the vertical direction (Z direction).

The central axis 470C1 of the inner diameter BD2 of the protective frame 474 and the central axis 120C of the optical collector 120 may be collinear. A straight line along the central axis 470C2 of the outer diameter AD2 of the protective frame 474 and a straight line along the central axis 120C of the optical collector 120 may not be collinear (e.g., dashed lines in FIG. 5C).

When the inner diameter DD2 of the support portion 474A is greater than the outer diameter OD of the edge portion of the optical collector 120 (see FIG. 2F), it may facilitate insertion of the edge portion of the optical collector 120 into the support portion 474A so as to couple the optical collector 120 to the debris shielding assembly 470. Once the edge portion of the optical collector 120 is inserted within the support portion 474A, an upper portion of the support portion 474A and an upper portion of the shield portion 474B of the debris shielding assembly 470 may partially contact the upper edge portion of the optical collector 120 due to gravity, so that the upper edge portion of the optical collector 120 may support the debris shielding assembly 470.

In the debris shielding assembly 470, the support portion 474A of the protective frame 474 may include a ring member extending having an L-like cross-sectional shape. In the coupling state as illustrated in FIG. 5C, as an upper edge portion of the support portion 474A having the L-like cross-sectional shape, the upper edge portion being bent towards the center of the protective frame 474, contacts the upper edge portion of the optical collector 120, the debris shielding assembly 470 may be supported by the optical collector 120. In the coupling position illustrated in FIG. 5C, the edge portion of the support portion 474A, bent toward the center of the protective frame 474, may function as a latch unit that may prevent detachment of the optical collector 120 downwards. That is, due to the edge portion of the protective frame 474 bent towards the center of the protective frame 474, detachment of the optical collector 120 from the protective frame 474 of the debris shielding assembly 470 may be prevented. Accordingly, no binding tools may be needed for coupling the optical collector 120 to the debris shielding assembly 470.

The shield portion 474B may have an inner surface S2 facing the protective space 180 between the support portion 474A and the protective film 272B. In the state where the optical collector 120 and the debris shielding assembly 470 are coupled together, an edge portion of the inner surface S2 of the shield portion 474B and an edge portion of the reflective surface 122 of the optical collector 120 may contact each other, and the inner surface S2 and the reflective surface 122 may continuously extend forming one plane without a step difference in a contact region between the inner surface S2 and the reflective surface 122.

Although FIGS. 5A to 5C illustrate the embodiments in which the debris shielding assembly 470 includes the protective film 272B, embodiments of the present disclosure are not limited thereto. For example, the debris shielding assembly 470 may include protective film 272A as illustrated in FIGS. 2A and 2B.

In the light generator 100 illustrated in FIG. 1, the debris shielding assembly 470 illustrated in FIGS. 5A and 5B may be employed instead of the debris shielding assembly 170. In the state where the optical collector 120 and the debris shielding assembly 470 are coupled together, the protective film 272B and the shield portion 474B may shield the protective space 180 from the plasma generation space (PS) (see FIG. 1). Accordingly, the debris generated in the plasma generation space (PS) is unlikely to flow into the protective space 180 through a space between protective film 272B and the optical collector 120 from the plasma generation space (PS). Accordingly, the reflective surface 122 of the optical collector 120 may be protected from contamination by the debris.

Figure 6A:
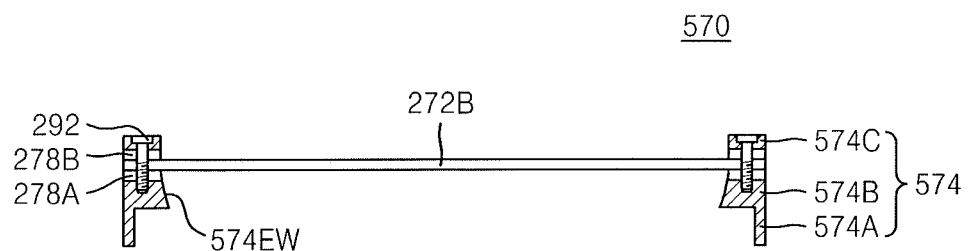
FIG. 6A illustrates a cross-sectional view of a debris shielding assembly according to another embodiment.
Figure 6B:
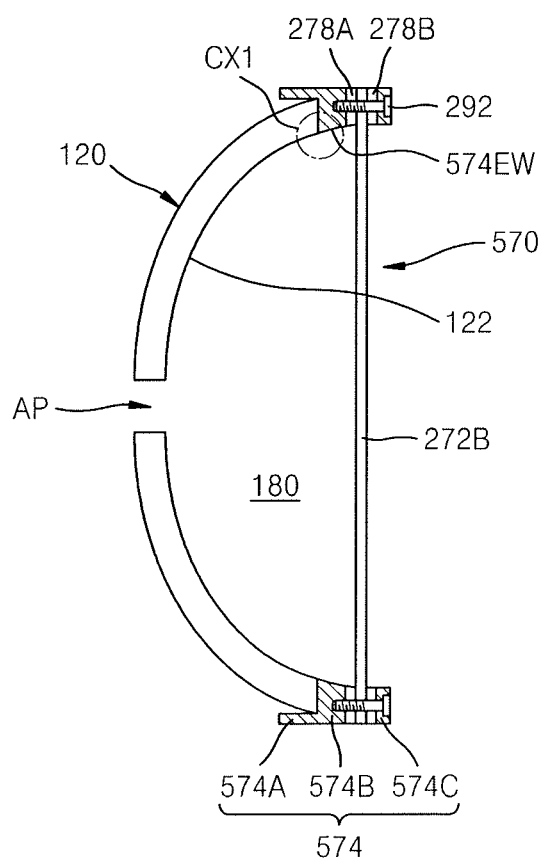
FIG. 6B illustrates a state where the optical collector and the debris shielding assembly are coupled together.
Figure 6C:
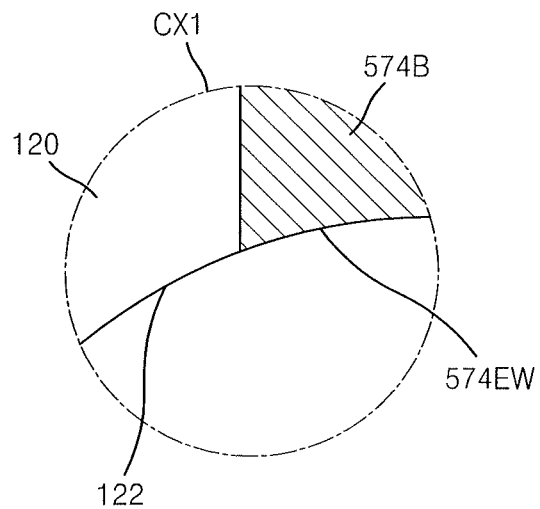
FIG. 6C illustrates an enlarged view of a region "CX1" in FIG. 6B.

FIG. 6A is a cross-sectional view for explaining an example configuration of a debris shielding assembly 570 according to an embodiment, which may be used in the light generator according to embodiments of the present disclosure. FIG. 6B is a sectional view illustrating a state where the optical collector 120 and the debris shielding assembly 570 are coupled together. FIG. 6C is an enlarged view of a region "CX1" in FIG. 6B. In FIGS. 6A to 6C, like reference numerals as those in FIGS. 1 to 3C refer to like elements, and thus redundant descriptions thereof are omitted.

Referring to FIGS. 6A to 6C, the debris shielding assembly 570 may have a substantially same configuration as the debris shielding assembly 270B illustrated in FIGS. 3A and 3B. Unlike the debris shielding assembly 270B, the debris shielding assembly 570 may include the protective film 272B, and a protective frame 574 supporting the protective film 272B. The protective frame 574 of the debris shielding assembly 570 may include a support portion 574A, a shield portion 574B, and an outer fixing portion 574C. The support portion 574A, the shield portion 574B, and the outer fixing portion 574C of the protective frame 574 may have substantially same configurations as the support portion 274A, the shield portion 274B, and the outer fixing portion 274C of the debris shielding assembly 270B, respectively, described above with reference to FIGS. 3A and 3B. Unlike the debris shielding assembly 270B, the shield portion 574B may have an inner surface 574EW facing the protective space 180 between the support portion 574A and the protective film 272B.

In detail, the inner surface 574EW may be a curved surface. In the state where the optical collector 120 and the debris shielding assembly 570 are coupled together, an edge portion of the inner surface 574EW of the shield portion 574B and an edge portion of the reflective surface 122 of the optical collector 120 may contact each other, and the inner surface 574EW and the reflective surface 122 may smoothly extend forming one plane without a step difference in a contact region between the inner surface 574EW and the reflective surface 122. In some embodiments, in the state where the optical collector 120 and the debris shielding assembly 570 are coupled to each other as illustrated in FIG. 6B, the inner surface 574EW of the shield portion 574B may form an elliptic surface together with the reflective surface 122 of the optical collector 120. As the inner surface 574EW forms such an elliptic surface, interruption of travel paths of EUV light (LT) reflected from the reflective surface 122 caused by the shield portion 574B may be reduced.

Although FIGS. 6A to 6C illustrate embodiments in which the debris shielding assembly 570 may include the protective film 272B, embodiments of the present disclosure are not limited thereto. For example, the debris shielding assembly 570 may include the protective film 272A as illustrated in FIGS. 2A and 2B.

Although FIGS. 6A and 6B illustrate the embodiments that the debris shielding assembly 570 includes the fixing member 292, embodiments of the present disclosure are not limited thereto. In some embodiments, the debris shielding assembly 570 may include, instead of the fixing member 292, the fixing member 394 illustrated above with reference to FIGS. 4A and 4B. In some other embodiments, instead of including the first buffer film 278A, the second buffer film 278B, the outer fixing portion 574C, and the fixing member 292, the debris shielding assembly 570 illustrated in FIGS. 6A and 6B may include the protective film 272B, which may be directly adhered onto the shield portion 574B by pressing, or by using the fixing member 176 in a similar manner as described above with reference to FIG. 1.

In the light generator 100 illustrated in FIG. 1, the debris shielding assembly 570 illustrated in FIGS. 6A and 6B may be employed instead of the debris shielding assembly 170. In the state where the optical collector 120 and the debris shielding assembly 570 are coupled together, the protective film 272B and the shield portion 574B may shield the protective space 180 in front of the reflective surface 122 of the optical collector 120 from the plasma generation space (PS) (see FIG. 1). Accordingly, the debris generated in the plasma generation space (PS) is unlikely to flow into the protective space 180 and the reflective surface 122 of the optical collector 120 from the plasma generation space (PS), so that the reflective surface 122 of the optical collector 120 may be protected from contamination by the debris.

Figure 7A:
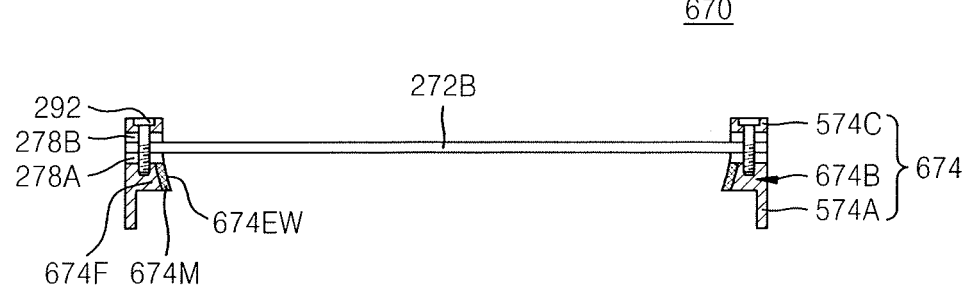
FIG. 7A illustrates a cross-sectional view of a debris shielding assembly according to another embodiment.
Figure 7B:
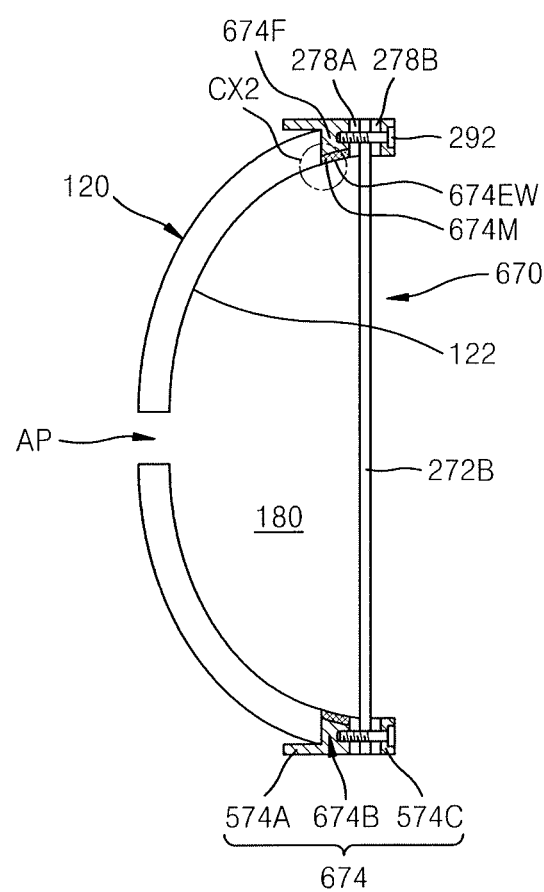
FIG. 7B illustrates a state where the optical collector and the debris shielding assembly are coupled together.
Figure 7C:
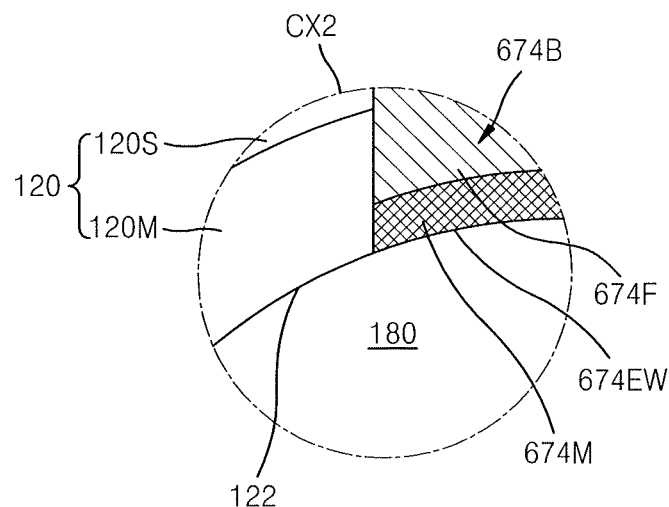
FIG. 7C illustrates an enlarged view of a region "CX2" in FIG. 7B.
Figure 7D:
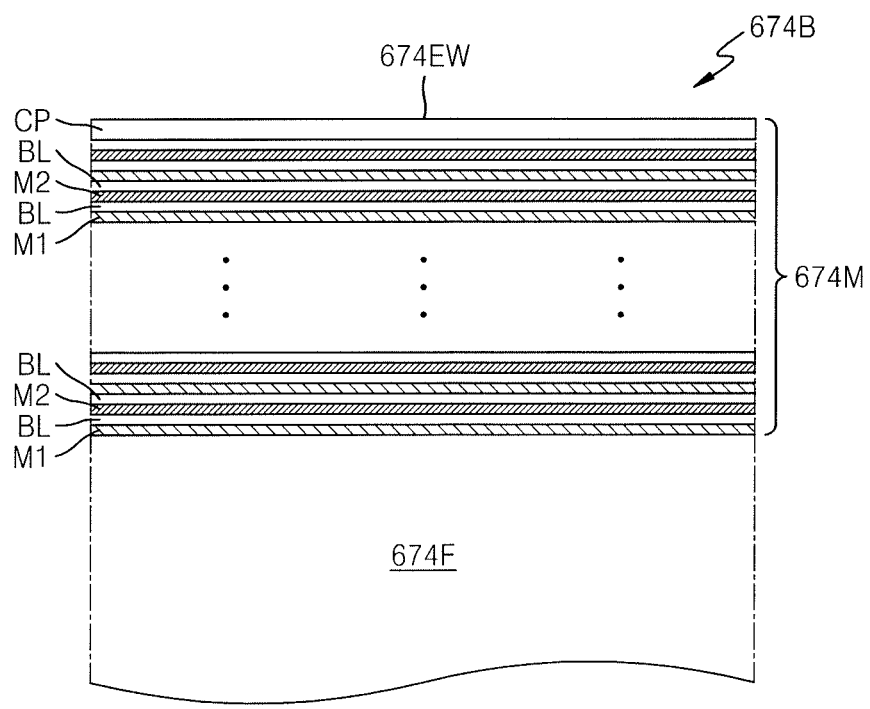
FIG. 7D illustrates an enlarged partial cross-sectional view of a shield portion in a protective frame of the debris shielding assembly of FIG. 7A.

FIG. 7A is a cross-sectional view for explaining an example configuration of a debris shielding assembly 670 according to an embodiment, which may be used in the light generator according to embodiments of the present disclosure. FIG. 7B is a sectional view illustrating a state where the optical collector 120 and the debris shielding assembly 670 are coupled together. FIG. 7C is an enlarged view of a region "CX2" in FIG. 7B. FIG. 7D is an enlarged partial cross-sectional view for explaining the shield portion 674B in the protective frame 674 of the debris shielding assembly 670. In FIGS. 7A to 7D, like reference numerals as those in FIGS. 1 to 6C refer to like elements, and thus redundant descriptions thereof are omitted.

Referring to FIGS. 7A to 7D, the debris shielding assembly 670 may have a substantially same configuration as the debris shielding assembly 570 described above with reference to FIGS. 6A to 6C. Unlike the debris shielding assembly 570, the debris shielding assembly 670 may include a protective frame 674 supporting the protective film 272B. A shield portion 674B of the protective frame 674 may include a shield frame 674F, and a reflective layer 674M on the shield frame 674F, the reflective layer 674M being exposed to the protective space 180.

The reflective layer 674M may have a reflective surface 674EW facing the protective space 180 between the support portion 574A and the protective film 272B. The reflective surface 674EW may be a curved surface. In some embodiments, the reflective layer 674M may include a multilayer mirror. The multilayer mirror may include a stack structure in which a plurality of layers selected from among a Mo layer, a Si layer, a SiC layer, a $B_4C$ layer, a $Mo_2C$ layer, and a $Si_3N_4$ layer may be alternately stacked one another.

In some embodiments, the reflective layer 674M may have a stack structure as illustrated in FIG. 7D. That is, the reflective layer 674M may include a plurality of first reflective layers M1, a plurality of second reflective layers M2, and a plurality of barrier layers BL stacked on the shield frame 674F. The first reflective layers M1 and the second reflective layers M2 may be alternately stacked one by one in the reflective layer 674M with one barrier layer BL between every adjacent two of the first reflective layer M1 and the second reflective layer M2.

In some embodiments, the first reflective layer M1 may include, e.g., consist of, a Mo layer, and the second reflective layer M2 may include a Si layer. The barrier layer BL may include a material that may be maintained in a stable state at a high temperature of several hundreds of degrees Celsius (° C.) or greater. In some embodiments, the barrier layer BL may include, e.g., consist of, carbide or nitride. For example, the barrier layer BL may include a SiC layer, a $B_4C$ layer, a $Mo_2C$ layer, a $Si_3N_4$ layer, or a combination thereof. The barrier layer BL may prevent diffusion of atoms between the first reflective layer M1 and the second reflective layer M2 at a high temperature. Accordingly, even when the reflective layer 674M reaches a high-temperature condition while the light generator including the debris shielding assembly 670 is in operation, performance of the reflective layer 674M may not be deteriorated due to the barrier layer BL, and the reflective ability of the reflective layer 674M may be maintained.

The reflective layer 674M may further include a capping layer CP. The capping layer CP may include ruthenium (Ru) or silicon oxide ($SiO_2$). In the state where the optical collector 120 and the debris shielding assembly 670 are coupled together, a top surface of the capping layer CP of the reflective layer 674M may provide the reflective surface 674EW exposed to the protective space 180.

The shield frame 674F may include a metal. For example, the shield frame 674F may include Al, stainless steel, Mo, or a combination thereof.

As illustrated in FIG. 7C, the optical collector 120 may include a collector substrate 120S, and a collector reflective layer 120M on the collector substrate 120S, the collector reflective layer 120M providing the reflective surface 122. The collector reflective layer 120M may have a similar reflective structure to the reflective layer 674M of the shield portion 674B. The reflective layer 674M of the shield portion 674B may have a thickness smaller than that of the collector reflective layer 120M. However, embodiments of the present disclosure are not limited thereto. For example, the reflective layer 674M of the shield portion 674B and the collector reflective layer 120M may have the same thickness.

In the state where the optical collector 120 and the debris shielding assembly 670 are coupled together, an edge portion of the reflective surface 674EW of the shield portion 674B and an edge portion of the reflective surface 122 of the optical collector 120 may contact each other. The reflective surface 674EW and the reflective surface 122 may smoothly extend forming one plane without a step difference in a contact region between the reflective surface 674EW and the reflective surface 122. In some embodiments, as illustrated in FIG. 7B, in the state where the optical collector 120 and the debris shielding assembly 670 are coupled together, the reflective surface 674EW of the shield portion 674B may form an elliptic surface together with the reflective surface 122 of the optical collector 120.

The reflective surface 674EW of the shield portion 674B may contribute to, together with the reflective surface 122 of the optical collector 120, collecting and reflecting EUV light having a wavelength of about 1 nm to about 31 nm, e.g., about 13.5 nm, of light having various wavelengths radiated from the plasma. For example, the reflective surface 674EW of the shield portion 674B may selectively reflect EUV light having a wavelength of about 13.5 nm. Accordingly, in addition to the reflection efficiency of the optical collector 120, a reflection efficiency of the reflective surface 674EW of the shield portion 674B may be additionally provided, so that a collecting efficiency for EUV light may be improved in the light generator including the debris shielding assembly 670.

Although FIGS. 7A and 7B illustrate embodiments in which the debris shielding assembly 670 includes the protective film 272B, embodiments of the present disclosure are not limited thereto. For example, the debris shielding assembly 670 may include the protective film 272A illustrated in FIGS. 2A and 2B.

Although FIGS. 7A and 7B illustrate embodiments in which the debris shielding assembly 670 may include the fixing member 292, embodiments of the present disclosure are not limited thereto. In some embodiments, the debris shielding assembly 670 may include the fixing member 394 described with reference to FIGS. 4A and 4B, instead of the fixing member 292. In some other embodiments, instead of including the first buffer film 278A, the second buffer film 278B, the outer fixing portion 574C and the fixing member 292, the debris shielding assembly 670 illustrated in FIGS. 7A and 7B may include the protective film 272B, which may be directly adhered onto the shield portion 674B by pressing, or by using the fixing member 176 in a similar manner as described above with reference to FIG. 1.

In the light generator 100 illustrated in FIG. 1, the debris shielding assembly 670 illustrated in FIGS. 7A and 7B may be employed instead of the debris shielding assembly 170. In the state where the optical collector 120 and the debris shielding assembly 670 are coupled together, the protective film 272B and the shield portion 674B may shield the protective space 180 in front of the reflective surface 122 of the optical collector 120 from the plasma generation space (PS) (see FIG. 1). Accordingly, the debris generated in the plasma generation space (PS) is unlikely to flow into the protective space 180 and the reflective surface 122 of the optical collector 120 from the plasma generation space (PS), so that the reflective surface 122 of the optical collector 120 may be protected from contamination by the debris.

Figure 8:
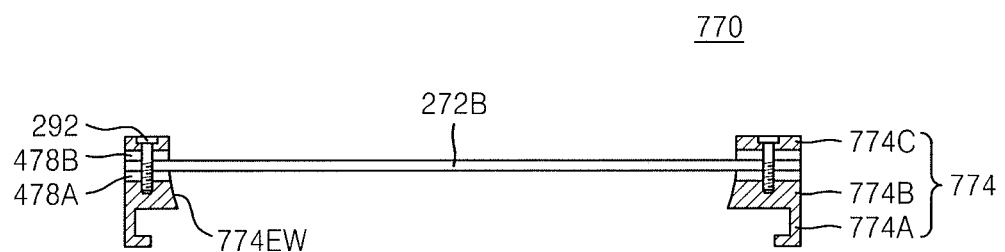
FIG. 8 illustrates a cross-sectional view of a debris shielding assembly according to another embodiment.

FIG. 8 is a cross-sectional view for explaining an example configuration of a debris shielding assembly 770 according to an embodiment, which may be used in the light generator according to embodiments of the present disclosure. In FIG. 8, like reference numerals as those in FIGS. 1 to 5C refer to like elements, and thus redundant descriptions thereof are omitted.

Referring to FIG. 8, the debris shielding assembly 770 may have a substantially same configuration as the debris shielding assembly 470 illustrated in FIGS. 5A to 5C. Unlike the debris shielding assembly 470, the debris shielding assembly 770 may include the protective film 272B and a protective frame 774 supporting the protective film 272B. The protective frame 774 of the debris shielding assembly 770 may include a support portion 774A, a shield portion 774B, and an outer fixing portion 774C. The support portion 774A, the shield portion 774B, and the outer fixing portion 774C of the protective frame 774 may have substantially same configurations as the support portion 474A, the shield portion 474B, and the outer fixing portion 474C of the debris shielding assembly 470, respectively, as described above with reference to FIGS. 5A to 5C. Unlike the debris shielding assembly 470, the shield portion 774B may have an inner surface 774EW between the support portion 774A and the protective film 272B.

In detail, the inner surface 774EW may be a curved surface. In the state where the debris shielding assembly 770 is coupled to the optical collector 120 illustrated in FIG. 5C, an edge portion of the inner surface 774EW of the shield portion 774B and an edge portion of the reflective surface 122 of the optical collector 120 may contact each other, and the inner surface 774EW and the reflective surface 122 may smoothly extend forming one plane without a step difference in a contact region between the inner surface 774EW and the reflective surface 122. In some embodiments, in the state where the debris shielding assembly 770 is coupled to the optical collector 120 illustrated in FIG. 5C, the inner surface 774EW of the shield portion 774B may form an elliptic surface together with the reflective surface 122 of the optical collector 120.

Although FIG. 8 illustrates an embodiment in which the debris shielding assembly 770 may include the protective film 272B, embodiments of the present disclosure are not limited thereto. For example, the debris shielding assembly 770 may include the protective film 272A illustrated in FIGS. 2A and 2B.

Although FIG. 8 illustrates an embodiment in which the debris shielding assembly 770 may include the fixing member 292. embodiments of the present disclosure are not limited thereto. In some embodiments, the debris shielding assembly 770 may include the fixing member 394 described above with reference to FIGS. 4A and 4B, instead of the fixing member 292. In some other embodiments, instead of including the first buffer film 478A, the second buffer film 478B, the outer fixing portion 774C, and the fixing member 292, the debris shielding assembly 770 illustrated in FIG. 8 may include the protective film 272B, which may be directly adhered onto the shield portion 774B by pressing, or by using the fixing member in a similar manner as described above with reference to FIG. 1.

In the light generator 100 illustrated in FIG. 1, the debris shielding assembly 770 illustrated in FIG. 8 may be employed instead of the debris shielding assembly 170. In the state where the optical collector 120 and the debris shielding assembly 770 are coupled together, the protective film 272B and the shield portion 774B may shield the protective space 180 in front of the reflective surface 122 of the optical collector 120 from the plasma generation space (PS) (see FIG. 1). Accordingly, the debris generated in the plasma generation space (PS) is unlikely to flow into the protective space 180 and the reflective surface 122 of the optical collector 120 from the plasma generation space (PS), so that the reflective surface 122 of the optical collector 120 may be protected from contamination by the debris.

Figure 9:
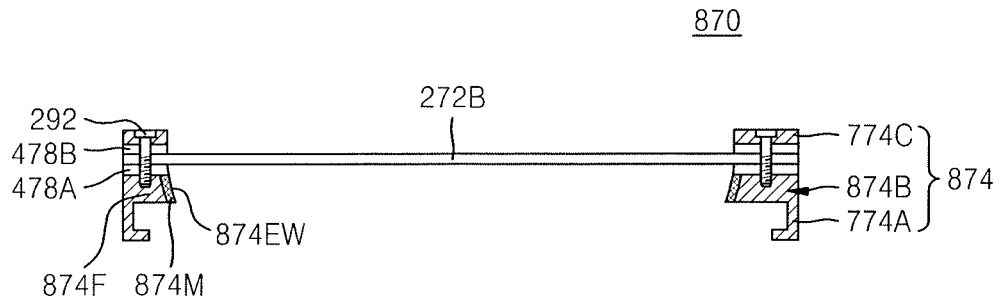
FIG. 9 illustrates a cross-sectional view of a debris shielding assembly according to another embodiment.

FIG. 9 is a cross-sectional view for explaining an example configuration of a debris shielding assembly 870 according to an embodiment, which may be used in the light generator according to embodiments of the present disclosure. In FIG. 9, like reference numerals as those in FIGS. 1 to 8 refer to like elements, and thus redundant descriptions thereof are omitted.

Referring to FIG. 9, the debris shielding assembly 870 may have a substantially same configuration as the debris shielding assembly 770 described above with reference to FIG. 8. Unlike the debris shielding assembly 770. the debris shielding assembly 870 may include a protective frame 874 supporting the protective film 272B. A shield portion 874B of the protective frame 874 may include a shield frame 874F, and a reflective layer 874M on the shield frame 874F. The reflective layer 874M may have a reflective surface 874EW between the support portion 774A and the protective film 272B. The reflective surface 874EW may be a curved surface. Detailed configurations of the shield frame 874F and the reflective layer 874M may be the same as those of the shield frame 674F and the reflective layer 674M, respectively, described above with reference to FIGS. 7A to 7D.

In the state where the debris shielding assembly 870 is coupled to the optical collector 120 illustrated in FIG. 5C, an edge portion of the reflective surface 874EW of the shield portion 874B and an edge portion of the reflective surface 122 of the optical collector 120 may contact each other, and the reflective surface 874EW and the reflective surface 122 may smoothly extend forming one plane without a step difference in a contact region between the reflective surface 874EW and the reflective surface 122. In some embodiments, in the stage where the debris shielding assembly 870 is coupled to the optical collector 120 illustrated in FIG. 5C, the reflective surface 874EW of the shield portion 874B may form an elliptic surface together with the reflective surface 122 of the optical collector 120.

The reflective surface 874EW of the shield portion 874B may contribute to, together with the reflective surface 122 of the optical collector 120, collecting and reflecting EUV light having a wavelength of about 1 nm to about 31 nm, for example, about 13.5 nm, of light having various wavelengths radiated from the plasma. For example, the reflective surface 874EW of the shield portion 874B may selectively reflect EUV light having a wavelength of about 13.5 nm. Accordingly, in addition to the reflection efficiency of the optical collector 120, a reflection efficiency by the reflective surface 874EW of the shield portion 874B may be additionally provided, so that a collecting efficiency for EUV light may be improved in the light generator including the debris shielding assembly 870.

Although FIG. 9 illustrates an embodiment in which the debris shielding assembly 870 may include the protective film 272B, embodiments of the present disclosure are not limited thereto. For example, the debris shielding assembly 870 may include the protective film 272A illustrated in FIGS. 2A and 2B.

Although FIG. 9 illustrates an embodiment in which the debris shielding assembly 870 may include the fixing member 292, embodiments of the present disclosure are not limited thereto. In some embodiments, the debris shielding assembly 870 may include the fixing member 394 described above with reference to FIGS. 4A and 4B, instead of the fixing member 292. In some other embodiments, instead of including the first buffer film 478A, the second buffer film 478B, the outer fixing portion 774C, and the fixing member 292, the debris shielding assembly 870 illustrated in FIG. 9 may include the protective film 272B, which may be directly adhered onto the shield portion 874B by pressing, or by using the fixing member 176 in a similar manner as described above with reference to FIG. 1.

In the light generator 100 illustrated in FIG. 1, the debris shielding assembly 870 illustrated in FIG. 9 may be employed instead of the debris shielding assembly 170. In the state where the optical collector 120 and the debris shielding assembly 870 are coupled together, the protective film 272B and the shield portion 874B may shield the protective space 180 in front of the reflective surface 122 of the optical collector 120 from the plasma generation space (PS) (see FIG. 1). Accordingly, the debris generated in the plasma generation space (PS) is unlikely to flow into the protective space 180 and the reflective surface 122 of the optical collector 120 from the plasma generation space (PS), so that the reflective surface 122 of the optical collector 120 may be protected from contamination by the debris.

Figure 10:
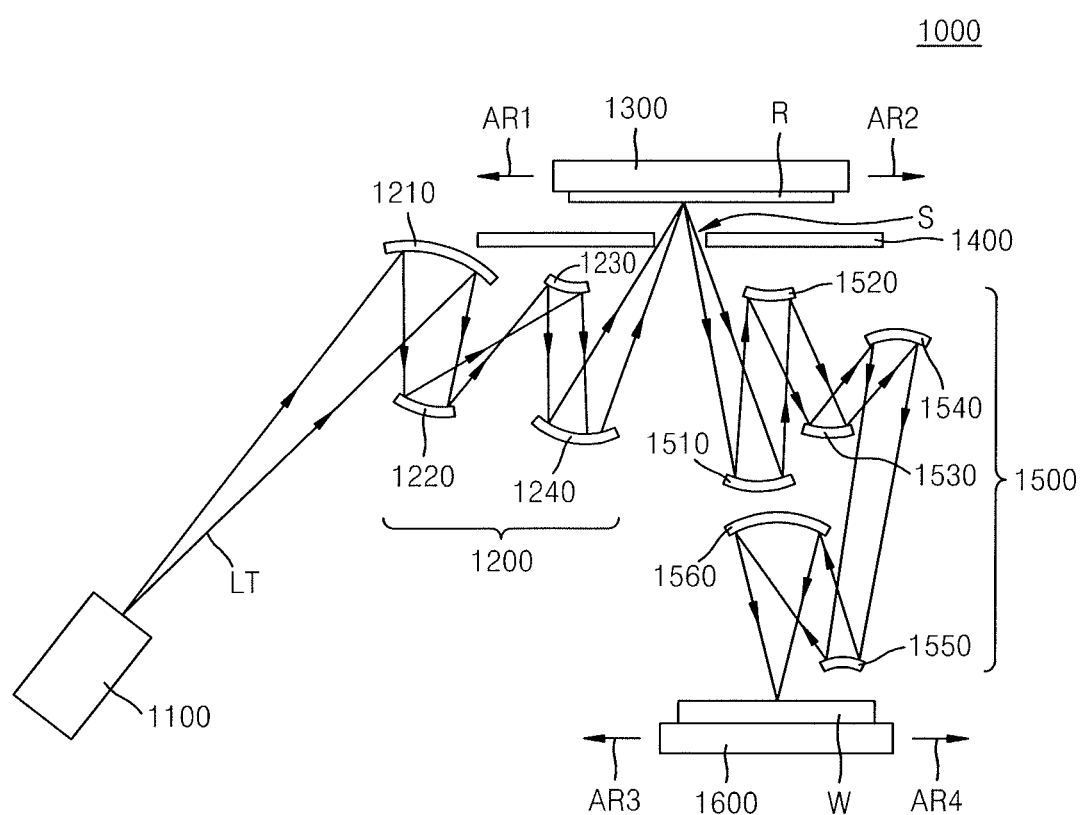
FIG. 10 illustrates a schematic view of main elements of a photolithographic apparatus according to embodiments of the present disclosure.

FIG. 10 is a schematic view illustrating main elements of a photolithographic apparatus 1000 according to embodiments of the present disclosure.

Referring to FIG. 10, the photolithographic apparatus 1000 may include a light generator 1100 according to embodiments of the present disclosure. In some embodiments, the light generator 1100 may include the light generator 100 according to an embodiment as illustrated in FIG. 1. In some embodiments, the light generator 1100 may include one of the debris shielding assemblies 170, 270A, 270B, 370, 470, 570, 670, 770, and 870 described above with reference to FIGS. 1 to 9.

The photolithographic apparatus 1000 may include an illumination optical system 1200, a reticle stage 1300, a blinder 1400, a projection optical system 1500, and a wafer stage 1600.

The EUV light ("LT" in FIG. 10) generated from the light generator 1100 may be radiated toward the illumination optical system 1200. The EUV light LT may have a wavelength of about 1 nm to about 31 nm, e.g., about 13.5 nm.

The illumination optical system 1200 may include a plurality of mirrors 1210, 1220, 1230, and 1240. The plurality of mirrors 1210, 1220, 1230, and 1240 may focus and transmit the EUV light LT to reduce a loss of the EUV light LT. The plurality of mirrors 1210, 1220, 1230, and 1240 may uniformly control a EUV light LT intensity distribution overall. The plurality of mirrors 1210, 1220, 1230, and 1240 may include a concave mirror, a convex mirror, or a combination thereto to verify paths of the EUV light LT. In FIG. 10, although the illumination optical system 1200 is illustrated as including four mirrors 1210, 1220, 1230, and 1240, the number and locations of the mirrors in the illumination optical system 1200 are not limited to the embodiment illustrated in FIG. 10. and various modifications and changes may made thereto. The illumination optical system 1200 may include a separate vacuum chamber. The illumination optical system 1200 may include various lenses and optical elements not described above.

The reticle stage 1300 may move in a horizontal direction as indicated by arrows AR1 and AR2 in FIG. 10, with a reticle R mounted on an electrostatic chuck therein. The reticle R may be mounted on a lower surface of the reticle stage 1300 such that optical patterns on a surface of the reticle R face downwards. The blinder 1400 may be disposed under the reticle stage 1300. The blinder 1400 may include a slit S. The slit S may shape the EUV light LT transmitted from the illumination optical system 1200 to the reticle R mounted on the reticle stage 1300. The EUV light LT transmitted from the illumination optical system 1200 may radiate a surface of the reticle R through the slit S of the blinder 1400.

The EUV light (LT) reflected from the reticle R fixed to the reticle stage 1300 may be transmitted to the projection optical system 1500 through the slit S. The projection optical system 1500 may receive the EUV light (LT) passed through the slit S and transmit the EUV light (LT) to a wafer W. The projection optical system 1500 may perform reduction projection of the patterns on the reticle R onto the wafer W.

The projection optical system 1500 may include a plurality of mirrors 1510, 1520, 1530, 1540, 1550, and 1560. The plurality of mirrors 1510, 1520, 1530, 1540, 1550, and 1560 may correct various aberrations. In FIG. 10, although the projection optical system 1500 is illustrated as including six mirrors 1510, 1520, 1530, 1540, 1550, and 1560, the number and locations of the mirrors in the projection optical system 1500 are not limited to the embodiment illustrated in FIG. 10, and various modifications and changes may made thereto.

The wafer stage 1600 may move in a horizontal direction as indicated by arrows AR3 and AR4.

In FIG. 10, the traveling paths of the EUV light (LT) are only for illustrative purposes, and the present disclosure of the present application is not limited to the embodiment illustrated in FIG. 10.

Although the photolithographic apparatus 1000 including the light generator 1100 according to embodiments of the present disclosure are described with reference to FIG. 10, embodiments of the present disclosure are not limited thereto. For example, the light generator 1100 according to embodiments of the present disclosure may be applied to a test apparatus using the EUV light generated in the light generator 1100. In some embodiments, the test apparatus may be an apparatus for testing a reticle or a substrate. In some other embodiments, the test apparatus may be metrology equipment for measuring or monitoring process variations such as focus, overlay, critical dimension, and the like.

Figure 11:
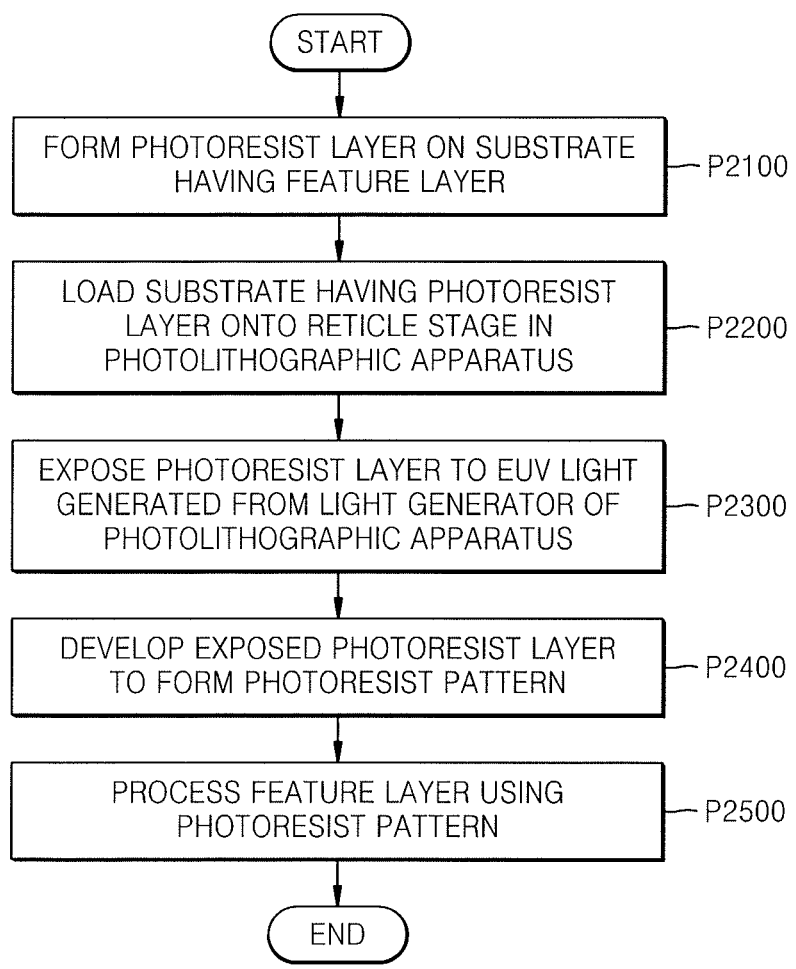
FIG. 11 illustrates a flowchart of a method of manufacturing an integrated circuit (IC) device, according to embodiments of the present disclosure.

FIG. 11 is a flowchart of a method of manufacturing an integrated circuit (IC) device, according to embodiments of the present disclosure.

Referring to FIG. 11, in an operation P2100, a photoresist layer may be formed on a substrate having a feature layer.

The substrate may include a semiconductor element such as silicon (Si) or germanium (Ge), or a compound semiconductor such as silicon carbide (SiC), gallium arsenide (GaAS), indium arsenide (InAs), and indium phosphide (InP). In some embodiments, the substrate may have a silicon on insulator (SOI) structure. For example, the substrate may include a buried oxide (BOX) layer. In some embodiments, the substrate may include a conductive region, for example, a well doped with impurities or a structure doped with impurities. The substrate may have various device isolation structures. for example, a shallow trench isolation (STI) structure. The substrate may have a structure including at least one layer of an insulating layer, a conductive layer, a semiconductor layer, a metal layer, a metal oxide layer, a metal nitride layer, a polymer layer, or a combination thereof on a semiconductor wafer.

In some embodiments, the substrate may include a semiconductor wafer. The feature layer may be formed on the semiconductor wafer. In this case, the feature layer may be a conductive layer or an insulating layer. For example, the feature layer may include a metal, a semiconductor, or an insulating material. In some embodiments, the feature layer may be a part of the substrate.

The photoresist layer may cover the feature layer. The photoresist layer may include a resist material for EUV light (13.5 nm).

Referring to FIGS. 10 and 11, in an operation P2200, the substrate having the photoresist layer formed thereon may be loaded on a reticle stage 1300 of the photolithographic apparatus 1000.

Referring to FIGS. 10 and 11, in an operation P2300, the photoresist layer may be exposed using the EUV light (LT) generated in the light generator 1100 of the photolithographic apparatus 1000.

Referring to FIG. 11, in an operation P2400, the exposed photoresist layer may be developed to thereby form a photoresist pattern.

Referring to FIG. 11, in operation P2500, the feature layer may be processed by using the photoresist pattern.

In some embodiments, to process the feature layer, the feature layer may be etched using the photoresist pattern as an etch mask to thereby form a feature pattern. In some other embodiments, to process the feature layer, impurity ions may be implanted into the feature layer using the photoresist pattern as an ion implantation mask. In some other embodiments, to process the feature layer, a separate process film may be formed on the feature layer that is exposed through the photoresist pattern formed in operation P2400. The process film may be a conductive layer, an insulating layer, a semiconductor layer, or a combination thereof.

Figure 12:
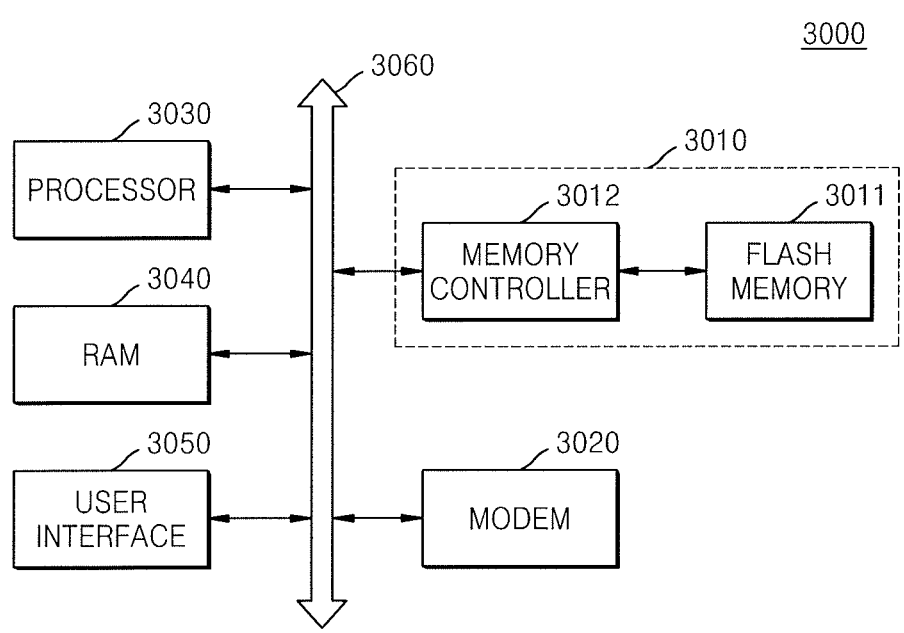
FIG. 12 illustrates a block diagram of a memory system including an IC device manufactured by using the method of manufacturing an IC device, according to embodiments of the present disclosure.

FIG. 12 is a block diagram of a memory system 3000 including an integrated circuit (IC) device manufactured by using the method of manufacturing an IC device, according to embodiments of the present disclosure.

Referring to FIG. 12, the memory system 3000 may include a memory card 3010. The memory system 3000 may include a modern 3020 that may communicate via a common bus 3060, a processor 3030 such as a central processing unit (CPU), random access memory 3040, and a user interface 3050. These elements may transmit signals to the memory card 3010 through common bus 3060 and may receive signals from the memory card 3010. The memory system 3000 may include an IC device manufactured using the method described above with reference to FIG. 11.

The memory system 3000 may be applicable to various electronic systems, for example, solid state disks (SSDs), CMOS image sensors (CISs), computer systems, or the like.

The IC devices disclosed herein may be encapsulated using any one of a ball grid array (BGA) technique, a chip scale package (CSP) technique, a plastic leaded chip carrier (PLCC) technique, a plastic dual in-line package (PDIP) technique, a multi-chip package (MCP) technique, a wafer-level fabricated package (WFP) technique, a wafer-level processed stack package (WSP) technique, and the like. However, embodiments of the present disclosure are not limited thereto.

By way of summation and review, in order to generate EUV light in the photolithographic apparatus. laser light may be radiated onto a target material in a vacuum chamber to convert the target material into a plasma state. However, debris. e.g., particles from the target material not converted into plasma, may be deposited on surfaces of optical elements in the vacuum chamber, thereby lowering operation efficiency thereof, e.g., reflectance or transmittance of the optical elements.

Attempts have been made to periodically clean the optical elements using various cleaning gases or radicals from such gases. However, such cleaning may increase the process unit price. Further, although the optical elements may be partially cleaned by cleaning gases or radicals, repeated deposition of the debris separated from the target material may lower optical characteristics, e.g., reflectance, of the optical elements or may deteriorate surfaces of the optical elements, consequently lowering durability of the optical elements.

In contrast, as described above with respect to one or more embodiments, a light generator according to the present disclosure may include a debris shielding assembly installed between optical elements which are prone to contamination by debris, and a plasma generation space (PS) in a chamber. Accordingly, the internal environment of the chamber may be maintained under a stable operation condition only by periodic cleaning and/or replacement of the components of the debris shielding assembly, without cleaning the optical elements in the chamber. As such, without the need to perform the cleaning process using a gas source, which may increase the process cost and deteriorate the optical elements, contamination of the optical elements by debris and consequential productivity reduction may be prevented. By inclusion of the light generator according to embodiments of the present disclosure, a photolithographic apparatus according to the present disclosure may lower the manufacturing cost and improve productivity in the process of manufacturing an IC device using the photolithographic apparatus.

That is, the provided light generator may prevent a reduction in operation efficiency of optical elements exposed in an optical path and increase the lifespan of the optical elements and may prolong a preventive maintenance (PM) cycle for cleaning and/or replacing parts of the optical elements. Further, the provided photolithographic apparatus may prevent a reduction in operation efficiency of optical elements exposed in an optical path and increase the lifespan of the optical elements and may prolong a PM cycle for cleaning and/or replacing parts of the optical elements, thereby lowering a manufacturing cost of integrated circuit (IC) devices and improving productivity. Finally, the provided method of manufacturing the IC device reduces the manufacturing costs and improves productivity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an integrated circuit (IC) device, the method comprising:
   forming a photoresist layer on a substrate; and
   exposing the photoresist layer to light by using a photolithographic apparatus including a light generator,
   wherein the light generator includes:
      a chamber having a plasma generation space,
      an optical collector in the chamber, the optical collector having an aperture, and
      a debris shielding assembly between the optical collector and the plasma generation space in the chamber,
   wherein the debris shielding assembly includes:
      a protective film facing the optical collector and being spaced apart from the optical collector with a protected space therebetween, the protected space including an optical path, the protective film having a through hole in a center region of the protective film, and the through hole being spaced apart from the aperture with the protected space therebetween, and
      a protective frame attaching the protective film to the optical collector, the protective frame to support the protective film and to shield the protected space from the plasma generation space.

2. The method as claimed in claim 1, wherein the protective film includes a material that is transparent with respect to a laser beam having a wavelength of about 1064 nm, a laser beam having a wavelength of about 10.6 µm, and extreme ultraviolet (EUV) light having a wavelength of about 13.5 nm.

3. The method as claimed in claim 1, wherein the protective film includes carbon nanotube, diamond, graphite, graphene, fullerene, or a combination thereof.

4. The method as claimed in claim 1, wherein the protective film includes a carbon nanotube film having single-wall carbon nanotubes (SWCNT), multiwall carbon nanotubes (MWCNT), or a combination thereof.

5. The method as claimed in claim 1, wherein the protective frame includes a metal.

6. The method as claimed in claim 1, wherein the protective frame includes:
   a support portion in contact with an edge portion of the optical collector; and
   a shield portion integrally connected with the support portion, the shield portion extending between the support portion and the protected film to shield the protective space from the plasma generation space.

7. The method as claimed in claim 1, wherein the protective frame includes:
   a support portion in contact to an edge portion of the optical collector;
   a shield portion extending between the support portion and the protective film to shield the protected space from the plasma generation space; and
   an outer fixing portion facing the shield portion with the protective film therebetween and supporting the protective film in cooperation with the shield portion.

8. The method as claimed in claim 7, wherein the protective frame further includes at least one of a first buffer film that is between the shield portion and the protective film, and a second buffer film that is between the protective film and the outer fixing portion.

9. The method as claimed in claim 7, wherein the shield portion includes an elliptic surface facing the protected space.

10. The method as claimed in claim 7, wherein the shield portion includes a reflective surface facing the protected space, and the reflective surface is an elliptic surface.

11. A method of manufacturing an integrated circuit (IC) device, the method comprising:
    forming a photoresist layer on a substrate; and
    exposing the photoresist layer to light by using a photolithographic apparatus including a light generator,
    wherein the light generator includes:
       a chamber having a plasma generation space,
       an optical collector in the chamber, the optical collector having an aperture and a reflective surface, and
       a debris shielding assembly between the optical collector and the plasma generation space in the chamber,
    wherein the debris shielding assembly includes:

a protective film spaced apart from the reflective surface with a protected space therebetween and facing the reflective surface, the protected space including an optical path, the protective film having a through hole at a position corresponding to the optical path in the protective film, and the through hole being spaced apart from the aperture with the protected space therebetween, and a protective frame that is in contact with an edge portion of the optical collector and supports the protective film.

12. The method as claimed in claim 11, wherein the protective frame includes:

a support portion in contact with the edge portion of the optical collector;

a shield portion integrally connected with the support portion and having an inner surface between the support portion and the protective film, the inner surface facing the protected space; and an outer fixing portion facing the shield portion with the protective film therebetween and supporting the protective film in cooperation with the shield portion.

13. The method as claimed in claim 12, wherein the support portion includes a ring member extending from the shield portion, the ring member having a straight cross-sectional shape or an L-like cross-sectional shape.

14. The method as claimed in claim 12, wherein the shield portion includes a shield frame and a reflective layer on the shield frame, the reflective layer being exposed to the protected space, and the reflective layer defining an elliptic surface together with the reflective surface of the optical collector.

15. The method as claimed in claim 11, wherein the protective frame has widths varying in a circumferential direction with respect to a central axis of the debris shielding assembly.

16. The method as claimed in claim 11, wherein the debris shielding assembly further includes a fixing member that couples the protective film and the protective frame.

17. A method of manufacturing an integrated circuit (IC) device, the method comprising:

forming a photoresist layer on a substrate; and exposing the photoresist layer to light by using a photolithographic apparatus including a light generator, wherein the light generator includes:

a chamber having a plasma generation space;

an optical collector in the chamber, the optical collector having an aperture and a reflective surface; and a debris shielding assembly between the optical collector and the plasma generation space in the chamber, wherein the debris shielding assembly includes:

a protective film facing the reflective surface with a protected space therebetween, the protected space including an optical path, the protective film having a through hole at a position corresponding to the optical path in the protective film, and the through hole being spaced apart from the aperture with the protected space therebetween, and a protective frame attaching the protective film to an edge of the optical collector, the protective frame extending along an entire perimeter of the edge of the optical collector.

18. The method as claimed in claim 17, wherein exposing the photoresist layer includes using EUV light generated in the light generator.

* * * * *